United States Patent
Ganti et al.

(10) Patent No.: US 12,501,578 B2
(45) Date of Patent: *Dec. 16, 2025

(54) MEMS-BASED COOLING SYSTEMS FOR CLOSED AND OPEN DEVICES

(71) Applicant: Frore Systems Inc., San Jose, CA (US)

(72) Inventors: Suryaprakash Ganti, Los Altos, CA (US); Seshagiri Rao Madhavapeddy, La Jolla, CA (US); Prabhu Sathyamurthy, San Jose, CA (US); Vikram Mukundan, San Ramon, CA (US); Lumaya Ahmed, Sunnyvale, CA (US)

(73) Assignee: Frore Systems Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/525,616

(22) Filed: Nov. 30, 2023

(65) Prior Publication Data

US 2024/0188249 A1 Jun. 6, 2024

Related U.S. Application Data

(63) Continuation of application No. 17/121,620, filed on Dec. 14, 2020, now Pat. No. 12,029,005.

(Continued)

(51) Int. Cl.
*H05K 7/20* (2006.01)
*H05K 5/02* (2006.01)
(Continued)

(52) U.S. Cl.
CPC ........... *H05K 7/20172* (2013.01); *H05K 5/03* (2013.01); *H05K 7/14* (2013.01); *H05K 7/20145* (2013.01)

(58) Field of Classification Search
CPC .... H05K 7/20145; H05K 7/14; H05K 5/0213; H05K 5/03; H05K 7/20509; B81B 7/0093; H01L 41/042; H01L 41/047
(Continued)

(56) References Cited

U.S. PATENT DOCUMENTS 4,063,826 A * 12/1977 Riepe ..................... F04D 33/00
417/436
4,251,031 A 2/1981 Martin
(Continued)

FOREIGN PATENT DOCUMENTS

CN 1684776 10/2005
CN 101032718 9/2007
(Continued)

OTHER PUBLICATIONS

H.Q. Li, "A High Frequency High Flow Rate Piezoelectrically Driven Mems Micropump", Solid-State Sensors, Actuators, and Microsystems Workshop, Jun. 4-8, 2000, pp. 69~72.
(Continued)

*Primary Examiner* — Anatoly Vortman
(74) *Attorney, Agent, or Firm* — Van Pelt, Yi & James LLP

(57) ABSTRACT

A system including an active cooling system is described. The active cooling system includes a cooling element in communication with a fluid and configured to use vibrational motion to direct a fluid toward a surface of heat-generating structure(s). Heat is transferred from the heat-generating structure to the fluid. The system is configured such that the fluid follows a path from the surface of the heat-generating structure(s) past a structure having a lower temperature than the surface of the heat-generating struc-
(Continued)

ture. The structure absorbs heat from the fluid. The structure is within the system and distal from the active cooling system.

18 Claims, 16 Drawing Sheets

Related U.S. Application Data

(60) Provisional application No. 63/079,448, filed on Sep. 16, 2020, provisional application No. 62/949,383, filed on Dec. 17, 2019.

(51) Int. Cl.
    *H05K 5/03*     (2006.01)
    *H05K 7/14*     (2006.01)

(58) Field of Classification Search
    USPC .................................................. 361/688, 704
    See application file for complete search history.

(56) References Cited

U.S. PATENT DOCUMENTS

| | | | |
|---|---|---|---|
| 4,450,505 A | 5/1984 | Mittal | |
| 4,512,933 A * | 4/1985 | Harden | A61L 9/122 |
| | | | 239/326 |
| 4,595,338 A | 6/1986 | Kolm | |
| 4,667,877 A | 5/1987 | Yao | |
| 4,751,713 A | 6/1988 | Affleck | |
| 4,780,062 A | 10/1988 | Yamada | |
| 4,834,619 A | 5/1989 | Walton | |
| 4,923,000 A | 5/1990 | Nelson | |
| 5,008,582 A | 4/1991 | Tanuma | |
| 5,673,171 A | 9/1997 | Varghese | |
| 5,758,823 A | 6/1998 | Glezer | |
| 5,796,152 A | 8/1998 | Carr | |
| 5,821,962 A | 10/1998 | Kudo | |
| 5,861,703 A | 1/1999 | Losinski | |
| 6,043,978 A * | 3/2000 | Mody | F04D 33/00 |
| | | | 361/678 |
| 6,211,598 B1 | 4/2001 | Dhuler | |
| 6,232,680 B1 | 5/2001 | Bae | |
| 6,450,773 B1 | 9/2002 | Upton | |
| 6,483,419 B1 | 11/2002 | Weaver | |
| 6,498,725 B2 | 12/2002 | Cole | |
| 6,531,947 B1 | 3/2003 | Weaver | |
| 6,570,750 B1 | 5/2003 | Calcatera | |
| 6,588,497 B1 | 7/2003 | Glezer | |
| 6,598,960 B1 | 7/2003 | Cabal | |
| 6,612,816 B1 | 9/2003 | Vanden Brande | |
| 6,650,542 B1 | 11/2003 | Chrysler | |
| 6,713,942 B2 | 3/2004 | Raman | |
| 6,771,158 B2 | 8/2004 | Lee | |
| 6,853,068 B1 | 2/2005 | Djekic | |
| 6,876,047 B2 | 4/2005 | Cunningham | |
| 6,996,441 B1 | 2/2006 | Tobias | |
| 7,023,697 B2 | 4/2006 | Pokharna | |
| 7,031,155 B2 | 4/2006 | Sauciuc | |
| 7,061,161 B2 * | 6/2006 | Scher | F04D 33/00 |
| | | | 310/328 |
| 7,081,699 B2 | 7/2006 | Keolian | |
| 7,248,475 B2 * | 7/2007 | Paydar | F04D 29/582 |
| | | | 165/122 |
| 7,258,464 B2 | 8/2007 | Morris | |
| 7,282,837 B2 | 10/2007 | Scher | |
| 7,321,184 B2 | 1/2008 | Lee | |
| 7,324,323 B2 | 1/2008 | Aksyuk | |
| 7,420,807 B2 | 9/2008 | Mikubo | |
| 7,492,076 B2 | 2/2009 | Heim | |
| 7,516,776 B2 | 4/2009 | Bezama | |
| 7,553,135 B2 | 6/2009 | Cho | |
| 7,619,894 B2 * | 11/2009 | Wang | F04D 29/582 |
| | | | 165/122 |
| 7,714,433 B2 | 5/2010 | Campini | |
| 7,742,299 B2 | 6/2010 | Sauciuc | |
| 7,972,124 B2 | 7/2011 | Hirata | |
| 8,051,905 B2 | 11/2011 | Arik | |
| 8,289,701 B2 | 10/2012 | Suzuki | |
| 8,297,947 B2 | 10/2012 | Van Rensburg | |
| 8,308,453 B2 | 11/2012 | Yamamoto | |
| 8,308,454 B2 | 11/2012 | Kamitani | |
| 8,520,383 B2 | 8/2013 | Park | |
| 8,520,384 B2 | 8/2013 | Park | |
| 8,659,896 B2 | 2/2014 | Dede | |
| 8,678,787 B2 | 3/2014 | Hirata | |
| 8,684,707 B2 | 4/2014 | Kanai | |
| 8,736,139 B2 | 5/2014 | Lee | |
| 8,899,944 B2 | 12/2014 | Kanai | |
| 8,934,240 B2 | 1/2015 | Yu | |
| 9,179,575 B1 | 11/2015 | Yao | |
| 9,215,520 B2 | 12/2015 | De Bock | |
| 9,252,069 B2 | 2/2016 | Bhunia | |
| 9,466,452 B1 | 10/2016 | Liu | |
| 9,523,367 B2 | 12/2016 | Lucas | |
| 9,788,457 B2 * | 10/2017 | Hessling von Heimendahl | |
| | | | F04D 33/00 |
| 9,846,461 B2 | 12/2017 | Tang | |
| 9,976,547 B2 | 5/2018 | Tanaka | |
| 10,018,429 B2 * | 7/2018 | Shen | F04B 43/043 |
| 10,045,461 B1 | 8/2018 | Boozer | |
| 10,288,192 B2 | 5/2019 | Han | |
| 10,364,910 B2 | 7/2019 | Han | |
| 10,480,502 B2 | 11/2019 | Hirata | |
| 10,788,034 B2 * | 9/2020 | Ganti | F04B 43/046 |
| 10,943,850 B2 | 3/2021 | Ganti | |
| 11,043,444 B2 | 6/2021 | Ganti | |
| 11,242,241 B2 | 2/2022 | Menon | |
| 11,293,459 B2 * | 4/2022 | Tsui | H01T 19/00 |
| 11,456,234 B2 | 9/2022 | Ganti | |
| 11,466,674 B2 | 10/2022 | Chang | |
| 11,532,536 B2 * | 12/2022 | Ganti | F04B 39/06 |
| 11,696,420 B2 * | 7/2023 | Kittur | H01H 71/08 |
| | | | 361/678 |
| 2002/0163782 A1 | 11/2002 | Cole | |
| 2002/0184907 A1 | 12/2002 | Vaiyapuri | |
| 2004/0023614 A1 | 2/2004 | Koplin | |
| 2004/0190251 A1 | 9/2004 | Prasher | |
| 2004/0196999 A1 | 10/2004 | Han | |
| 2004/0218362 A1 | 11/2004 | Amaro | |
| 2004/0244405 A1 | 12/2004 | Kim | |
| 2004/0253130 A1 | 12/2004 | Sauciuc | |
| 2005/0072559 A1 | 4/2005 | Ippoushi | |
| 2005/0074662 A1 | 4/2005 | Cho | |
| 2005/0089415 A1 | 4/2005 | Cho | |
| 2005/0110841 A1 | 5/2005 | Silverbrook | |
| 2005/0178529 A1 | 8/2005 | Suzuki | |
| 2005/0211418 A1 | 9/2005 | Kenny | |
| 2005/0225213 A1 | 10/2005 | Richards | |
| 2005/0266286 A1 | 12/2005 | Sato | |
| 2005/0280994 A1 | 12/2005 | Yazawa | |
| 2006/0147324 A1 | 7/2006 | Tanner | |
| 2006/0164805 A1 | 7/2006 | Meinders | |
| 2006/0181848 A1 | 8/2006 | Kiley | |
| 2006/0208613 A1 | 9/2006 | Scher | |
| 2006/0232167 A1 | 10/2006 | Jordan | |
| 2006/0236710 A1 | 10/2006 | Vaiyapuri | |
| 2006/0250773 A1 | 11/2006 | Campbell | |
| 2006/0250774 A1 | 11/2006 | Campbell | |
| 2006/0260784 A1 | 11/2006 | Bezama | |
| 2006/0268534 A1 | 11/2006 | Paydar | |
| 2007/0020124 A1 | 1/2007 | Singhal | |
| 2007/0037506 A1 | 2/2007 | Lee | |
| 2007/0048154 A1 | 3/2007 | Sapir | |
| 2007/0076375 A1 | 4/2007 | Mongia | |
| 2007/0127210 A1 * | 6/2007 | Mahalingam | H01L 23/427 |
| | | | 165/41 |
| 2007/0235180 A1 | 10/2007 | Ouyang | |
| 2007/0274045 A1 | 11/2007 | Campbell | |
| 2008/0041574 A1 | 2/2008 | Arik | |
| 2008/0062644 A1 * | 3/2008 | Petroski | F04D 33/00 |
| | | | 361/695 |
| 2008/0101965 A1 | 5/2008 | Zhang | |

(56) References Cited

U.S. PATENT DOCUMENTS

| | | |
|---|---|---|
| 2008/0111866 A1 | 5/2008 | Silverbrook |
| 2008/0218972 A1 | 9/2008 | Sauciuc |
| 2008/0304979 A1 | 12/2008 | Lucas |
| 2009/0021908 A1 | 1/2009 | Patel |
| 2009/0034197 A1 | 2/2009 | Leija |
| 2009/0050294 A1 | 2/2009 | Fedorov |
| 2009/0085438 A1 | 4/2009 | Chrysler |
| 2009/0120621 A1 | 5/2009 | Sheinman |
| 2009/0148320 A1 | 6/2009 | Lucas |
| 2009/0167109 A1 | 7/2009 | Tomita |
| 2009/0174999 A1 | 7/2009 | Sauciuc |
| 2009/0232683 A1 | 9/2009 | Hirata |
| 2009/0232684 A1 | 9/2009 | Hirata |
| 2009/0232685 A1 | 9/2009 | Kamitani |
| 2010/0067191 A1 | 3/2010 | Arik |
| 2010/0073431 A1 | 3/2010 | Silverbrook |
| 2010/0074775 A1 | 3/2010 | Yamamoto |
| 2011/0063800 A1 | 3/2011 | Park |
| 2011/0068685 A1 | 3/2011 | Maeng |
| 2011/0068799 A1 | 3/2011 | Wolf |
| 2011/0096125 A1 | 4/2011 | Silverbrook |
| 2011/0122582 A1 | 5/2011 | Park |
| 2011/0211020 A1 | 9/2011 | Silverbrook |
| 2011/0259557 A1 | 10/2011 | Chao |
| 2011/0277491 A1 | 11/2011 | Wu |
| 2011/0304240 A1 | 12/2011 | Meitav |
| 2012/0048522 A1* | 3/2012 | Hessling ............... H01L 23/473 165/120 |
| 2012/0063091 A1 | 3/2012 | Dede |
| 2012/0171062 A1 | 7/2012 | Kodama |
| 2012/0301333 A1 | 11/2012 | Smirnov |
| 2013/0058818 A1 | 3/2013 | Hirata |
| 2013/0071269 A1 | 3/2013 | Fujisaki |
| 2013/0157729 A1 | 6/2013 | Tabe |
| 2013/0225065 A1 | 8/2013 | Lee |
| 2013/0233523 A1 | 9/2013 | Parida |
| 2014/0052429 A1 | 2/2014 | Kelkar |
| 2014/0192485 A1 | 7/2014 | Rau |
| 2014/0216696 A1 | 8/2014 | Donnelly |
| 2015/0007965 A1 | 1/2015 | Joshi |
| 2015/0009631 A1 | 1/2015 | Joshi |
| 2015/0043164 A1 | 2/2015 | Joshi |
| 2015/0173237 A1 | 6/2015 | Lin |
| 2015/0308377 A1 | 10/2015 | Packard |
| 2016/0025429 A1 | 1/2016 | Muir |
| 2016/0076530 A1 | 3/2016 | Chen |
| 2016/0353186 A1 | 12/2016 | Rothkopf |
| 2016/0358841 A1 | 12/2016 | Eid |
| 2016/0377072 A1 | 12/2016 | Wu |
| 2016/0377073 A1 | 12/2016 | Tanaka |
| 2017/0146039 A1 | 5/2017 | Lin |
| 2017/0222123 A1 | 8/2017 | Chen |
| 2017/0276149 A1 | 9/2017 | Dusseau |
| 2017/0292537 A1 | 10/2017 | Barak |
| 2017/0363076 A1 | 12/2017 | Najafi |
| 2018/0061737 A1 | 3/2018 | Arik |
| 2018/0145010 A1 | 5/2018 | Fukuoka |
| 2018/0146573 A1 | 5/2018 | Chen |
| 2018/0146574 A1 | 5/2018 | Chen |
| 2018/0187672 A1 | 7/2018 | Tanaka |
| 2018/0240734 A1 | 8/2018 | Liao |
| 2019/0062150 A1 | 2/2019 | Moitzi |
| 2019/0067550 A1 | 2/2019 | Mou |
| 2019/0085836 A1 | 3/2019 | Mou |
| 2019/0101938 A1 | 4/2019 | Mou |
| 2019/0301442 A1 | 10/2019 | Hao |
| 2019/0309744 A1 | 10/2019 | Ting |
| 2020/0049143 A1 | 2/2020 | Ganti |
| 2020/0049386 A1 | 2/2020 | Ganti |
| 2020/0053905 A1 | 2/2020 | Ganti |
| 2020/0088185 A1 | 3/2020 | Mou |
| 2020/0229320 A1 | 7/2020 | Mou |
| 2021/0131415 A1 | 5/2021 | Yalamarthy |
| 2021/0144884 A1 | 5/2021 | Mou |
| 2021/0176894 A1 | 6/2021 | Yalamarthy |
| 2021/0176895 A1 | 6/2021 | Mukundan |
| 2021/0180723 A1 | 6/2021 | Mukundan |
| 2021/0183739 A1 | 6/2021 | Sathyamurthy |
| 2021/0185853 A1 | 6/2021 | Ganti |
| 2021/0185856 A1 | 6/2021 | Ganti |
| 2022/0081284 A1 | 3/2022 | Ganti |
| 2022/0087058 A1 | 3/2022 | Sankar |
| 2022/0087064 A1 | 3/2022 | Ganti |
| 2022/0150335 A1 | 5/2022 | Sathyamurthy |
| 2022/0187033 A1 | 6/2022 | Sankar |
| 2022/0189852 A1 | 6/2022 | Sathyamurthy |
| 2022/0282932 A1 | 9/2022 | Sathyamurthy |

FOREIGN PATENT DOCUMENTS

| | | |
|---|---|---|
| CN | 101415945 | 4/2009 |
| CN | 101568728 | 10/2009 |
| CN | 101718235 | 6/2010 |
| CN | 101785103 | 7/2010 |
| CN | 103828050 | 5/2014 |
| CN | 204436756 | 7/2015 |
| CN | 104832407 | 8/2015 |
| CN | 106206490 | 12/2016 |
| CN | 106849747 | 6/2017 |
| CN | 107642483 | 1/2018 |
| CN | 207287973 | 5/2018 |
| CN | 109641738 | 4/2019 |
| CN | 113898563 | 4/2022 |
| EP | 3290211 | 3/2018 |
| GB | 2443329 | 4/2008 |
| JP | S59152793 | 8/1984 |
| JP | S62149158 | 9/1987 |
| JP | S62199999 | 9/1987 |
| JP | H04065862 | 3/1992 |
| JP | H07263598 | 10/1995 |
| JP | H09246766 | 9/1997 |
| JP | 2000263882 | 11/2000 |
| JP | 2001119181 | 4/2001 |
| JP | 2002130198 | 5/2002 |
| JP | 2008159688 | 7/2008 |
| JP | 2008525709 | 7/2008 |
| JP | 2008263830 | 11/2008 |
| JP | 2010029759 | 2/2010 |
| JP | 2011144743 | 7/2011 |
| JP | 2013223818 | 10/2013 |
| JP | 2018022868 | 2/2018 |
| JP | 2018085510 | 5/2018 |
| JP | 2018085511 | 5/2018 |
| JP | 2018085512 | 5/2018 |
| JP | 6528849 | 6/2019 |
| JP | 2022535009 | 8/2022 |
| KR | 20050026992 | 3/2005 |
| KR | 100594802 | 7/2006 |
| KR | 20070063029 | 6/2007 |
| TW | 200635493 | 10/2006 |
| TW | 201638469 | 11/2016 |
| TW | M542326 | 5/2017 |
| TW | 201814772 | 4/2018 |
| WO | 2014024608 | 2/2014 |

OTHER PUBLICATIONS

Liu et al., Application Prospects of Microfluidics Technology in Electronic Chip Cooling Research, Cryo & Supercond, vol. 37, No. 9, Sep. 16, 2009.

Murata Manufacturing Co., Ltd., Microblower MZB1001T02, Microblower (Air Pump), Micro Mechatronics, Apr. 2014, downloaded from: https://www.murata.com/en-us/products/mechatronics/fluid/microblower_mzb1001t02.

* cited by examiner

MEMS-BASED COOLING SYSTEMS FOR CLOSED AND OPEN DEVICES

CROSS REFERENCE TO OTHER APPLICATIONS

This application is a continuation of U.S. patent application Ser. No. 17/121,620, entitled MEMS-BASED COOLING SYSTEMS FOR CLOSED AND OPEN DEVICES filed Dec. 14, 2020 which is incorporated herein by reference for all purposes, which claims priority to U.S. Provisional Patent Application No. 63/079,448 entitled MEMS BASED COOLING SYSTEM FOR CLOSED DEVICES filed Sep. 16, 2020, and U.S. Provisional Patent Application No. 62/949,383 entitled AIRFLOW CONTROL SYSTEM IN PIEZOELECTRIC COOLING FOR DEVICES filed Dec. 17, 2019, both of which are incorporated herein by reference for all purposes.

BACKGROUND OF THE INVENTION

As computing devices grow in speed and computing power, the heat generated by the computing devices also increases. Various mechanisms have been proposed to address the generation of heat. Active devices, such as fans, may be used to drive air through large computing devise, such as laptop computers or desktop computers. Passive cooling devices, such as heat spreaders, may be used in smaller, mobile computing devices, such as smartphones, virtual reality devices and tablet computers. However, such active and passive devices may be unable to adequately cool both mobile devices such as smartphones and larger devices such as laptops and desktop computers. Consequently, additional cooling solutions for computing devices are desired.

BRIEF DESCRIPTION OF THE DRAWINGS

Various embodiments of the invention are disclosed in the following detailed description and the accompanying drawings.

DETAILED DESCRIPTION

Figure 1A:
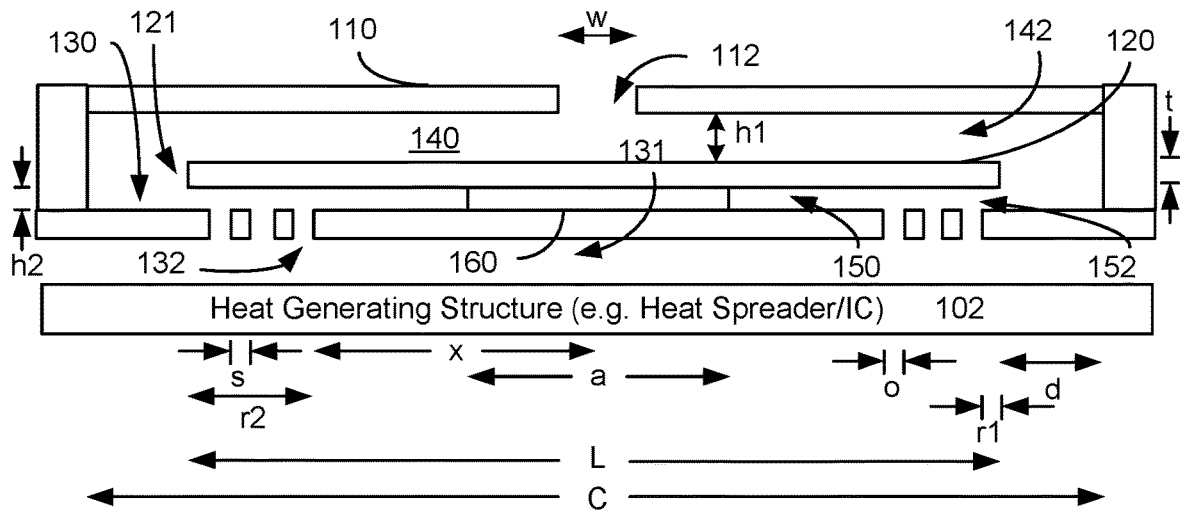
FIGS. 1A-1E depict an embodiment of an active cooling system including a centrally anchored cooling element.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As semiconductor devices become increasingly powerful, the heat generated during operations also grows. For example, processors for mobile devices such as smartphones, tablet computers, notebooks, and virtual reality devices can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed and, therefore, the performance of devices using the processors. As technology moves to 5G and beyond, this issue is expected to be exacerbated.

Larger devices, such as laptop or desktop computers include electric fans that have rotating blades. The fan that can be energized in response to an increase in temperature of internal components. The fans drive air through the larger devices to cool internal components. However, such fans are typically too large for mobile devices such as smartphones or for thinner devices such as tablet computers. Fans also may have limited efficacy because of the boundary layer of air existing at the surface of the components, provide a limited airspeed for air flow across the hot surface desired to be cooled and may generate an excessive amount of noise. Passive cooling solutions may include components such as a heat spreader and a heat pipe or vapor chamber to transfer heat to a heat exchanger. Although a heat spreader somewhat mitigates the temperature increase at hot spots, the amount of heat produced in current and future devices may not be adequately addressed. Similarly, a heat pipe or vapor chamber may provide an insufficient amount of heat transfer to remove excessive heat generated.

Varying configurations of computing devices further complicate heat management. For example, computing devices such as laptops are frequently open to the external environment while other computing devices, such as smartphones, are generally closed to the external environment. Thus, active heat management solutions for open devices, such as fans, may be inappropriate for closed devices. A fan driving heated fluid from the inside of the computing device to the outside environment may be too large for closed computing devices such as smartphones and may provide limited fluid flow. In addition, the closed computing device has no outlet for the heated fluid even if the fan can be incorporated into the closed computing device. Thus, the thermal management provided by such an open-device mechanism may have limited efficacy. Even for open computing devices, the location of the inlet and/or outlet may be configured differently for different devices. For example, an outlet for fan-driven fluid flow in a laptop may be desired to be located away from the user's hands or other structures that may lie within the outflow of heated fluid. Such a configuration not only prevents the user's discomfort but also allows the fan to provide the desired cooling. Another mobile device having a different configuration may require the inlets and/or outlets to be configured differently, may reduce the efficacy of such heat management systems and may prevent the use of such heat management systems. Thus, mechanisms for improving cooling in computing devices are desired.

A system including an active cooling system is described. The active cooling system includes a cooling element in communication with a fluid and configured to use vibrational motion to direct a fluid toward a surface of heat-generating structure(s). Heat is transferred from the heat-generating structure to the fluid. The system is configured such that the fluid follows a path from the surface of the heat-generating structure(s) past a structure having a lower temperature than the surface of the heat-generating structure. The structure absorbs heat from the fluid. The structure is within the system and distal from the active cooling system.

In some embodiments, the system is configured such that the fluid follows the path from the surface of the heat-generating structure(s) past the structure and returns to the active cooling system. Thus, the system may be a closed system. The system may include at least one vent allowing fluid communication with an external environment. Thus, the system may be an open system. In such embodiments, system is configured such that the fluid follows the path from the surface of the heat-generating structure(s) past the structure and exits the system to the external environment through the vent(s). For example, the system may include an inlet and an outlet. Fluid may enter through the inlet, travel to the active cooling system and be driven toward the surface of the heat-generating structure. Fluid thus follows the path from the surface of the heat-generating structure(s) past the structure and through the outlet.

The cooling element of the active cooling system may include a first side and a second side. The first side is distal to the heat-generating structure(s) and in communication with the fluid. The second side is proximal to the heat-generating structure(s). The cooling element is configured to direct the fluid from the first side to the second side using the vibrational motion such that the fluid is driven toward the surface of the heat-generating structure(s). In some embodiments, the active cooling system further includes a support structure and the cooling element is selected from a centrally anchored cooling element and an edge anchored cooling element. The centrally anchored cooling element has a central region and a perimeter. The centrally anchored cooling element is supported by the support structure at the central region. At least a portion of the perimeter is unpinned. The edge anchored cooling element has a central portion and an edge. The edge anchored cooling element is supported by the support structure at the edge and has at least one aperture therein. The active cooling system may also include an orifice plate having orifice(s) therein. The orifice plate is disposed between the cooling element and the surface of the heat-generating structure(s). The cooling element is actuated to drive the fluid through the orifice(s). The fluid travels from the orifice(s) toward the surface of the heat-generating structure(s). In some embodiments, the active cooling system has a thickness of not more than two millimeters.

The heat-generating structure(s) may have characteristic power versus time curves. A curve may have a characteristic throttling point at a first time. The heat-generating structure(s) have actively cooled power versus time curve(s). These curves for active cooling may have an actively cooled throttling point at a second time. The first time is less than the second time.

In some embodiments, a system includes multiple cooling cells. Each of the cooling cells includes a cooling element in communication with a fluid. The cooling element is also configured to use vibrational motion to direct the fluid toward a surface of heat-generating structure(s) to extract heat from the heat-generating structure(s). The system is configured such that the fluid follows a path from the surface of the heat-generating structure(s) past a structure within the system, having a temperature lower than the surface the heat-generating structure(s) and distal from the active cooling system. The structure absorbs heat from the fluid. In some embodiments, the system is configured such that the fluid follows the path from the surface of the heat-generating structure(s) past the structure and returns to the active cooling system. In some embodiments, the system includes at least one vent allowing fluid communication with an external environment. In such embodiments, the system is configured such that the fluid follows the path from the surface of the heat-generating structure(s) past the structure and exits the system to the external environment through the at least one vent.

In some embodiments, the cooling element includes a first side and a second side. The first side is distal to the heat-generating structure(s) and in communication with the fluid. The second side is proximal to the heat-generating structure(s). The cooling element is configured to direct the fluid from the first side to the second side using the vibrational motion such that the fluid travels toward the surface of the at least one heat-generating structure. The cooling element may be selected from a centrally anchored cooling element and an edge pinned cooling element. In some embodiments, the active cooling system includes an orifice plate having orifice(s) therein. The orifice plate is disposed between the cooling element and the surface of the heat-generating structure(s). The cooling element is actuated to drive the fluid through the orifice(s). The fluid travels from the orifice(s) toward the surface of the heat-generating structure(s). In some embodiments, the active cooling system has a thickness of not more than two millimeters.

The heat-generating structure(s) may have characteristic power versus time curves. A curve may have a characteristic throttling point at a first time. The heat-generating structure(s) have actively cooled power versus time curve(s). These curves for active cooling may have an actively cooled throttling point at a second time. The first time is less than the second time.

A method is also described. The method includes driving a cooling element of an active cooling system to induce vibrational motion at a frequency. The cooling element is in communication with a fluid and configured to use the vibrational motion to direct the fluid toward a surface of heat-generating structure(s) to extract heat from the heat-generating structure(s). The method also includes directing the fluid to follow a path from the surface of the heat-generating structure(s) past a structure having a lower temperature than the surface of the heat-generating structure. The structure is within the system, distal from the active cooling system and absorbs heat from the fluid. In some embodiments the fluid is directed to follow the path from the surface of the heat-generating structure(s) past the component and returns to the active cooling system. In some embodiments, the fluid is directed to follow the path from the surface of the at least one heat-generating structure past the component and to exit the system to an external environment through at least one vent.

FIGS. 1A-IE are diagrams depicting an exemplary embodiment of active cooling system 100 usable with heat-generating structure 102 and including a centrally anchored cooling element 120. For clarity, only certain components are shown. FIGS. 1A-1E are not to scale. Although shown as symmetric, cooling system 100 need not be.

Cooling system 100 includes top plate 110 having vent 112 therein, cooling element 120, orifice plate 130 having orifices 132 therein, support structure (or "anchor") 160 and chambers 140 and 150 (collectively chamber 140/150) formed therein. Cooling element 120 is supported at its central region by anchor 160. Regions of cooling element 120 closer to and including portions of the cooling element's perimeter (e.g. tip 121) vibrate when actuated. In some embodiments, tip 121 of cooling element 120 includes a portion of the perimeter furthest from anchor 160 and undergoes the largest deflection during actuation of cooling element 120. For clarity, only one tip 121 of cooling element 120 is labeled in FIG. 1A.

FIG. 1A depicts cooling system 100 in a neutral position. Thus, cooling element 120 is shown as substantially flat. For in-phase operation, cooling element 120 is driven to vibrate between positions shown in FIGS. 1B and 1C. This vibrational motion draws fluid (e.g. air) into vent 112, through chambers 140 and 150 and out orifices 132 at high speed and/or flow rates. For example, the speed at which the fluid impinges on heat-generating structure 102 may be at least thirty meters per second. In some embodiments, the fluid is driven by cooling element 120 toward heat-generating structure 102 at a speed of at least forty-five meters per second. In some embodiments, the fluid is driven toward heat-generating structure 102 by cooling element 120 at speeds of at least sixty meters per second. Other speeds may be possible in some embodiments. Cooling system 100 is also configured so that little or no fluid is drawn back into chamber 140/150 through orifices 132 by the vibrational motion of cooling element 120.

Heat-generating structure 102 is desired to be cooled by cooling system 100. In some embodiments, heat-generating structure 102 generates heat. For example, heat-generating structure may be an integrated circuit. In some embodiments, heat-generating structure 102 is desired to be cooled but does not generate heat itself. Heat-generating structure 102 may conduct heat (e.g. from a nearby object that generates heat). For example, heat-generating structure 102 might be a heat spreader or a vapor chamber. Thus, heat-generating structure 102 may include semiconductor component(s) including individual integrated circuit components such as processors, other integrated circuit(s) and/or chip package(s); sensor(s); optical device(s); one or more batteries; other component(s) of an electronic device such as a computing device; heat spreaders; heat pipes; other electronic component(s) and/or other device(s) desired to be cooled.

The devices in which cooling system 100 is desired to be used may also have limited space in which to place a cooling system. For example, cooling system 100 may be used in computing devices. Such computing devices may include but are not limited to smartphones, tablet computers, laptop computers, tablets, two-in-one laptops, hand held gaming systems, digital cameras, virtual reality headsets, augmented reality headsets, mixed reality headsets and other devices that are thin. Cooling system 100 may be a micro-electro-mechanical system (MEMS) cooling system capable of residing within mobile computing devices and/or other devices having limited space in at least one dimension. For example, the total height of cooling system 100 (from the top of heat-generating structure 102 to the top of top plate 110) may be less than 2 millimeters. In some embodiments, the total height of cooling system 100 is not more than 1.5 millimeters. In some embodiments, this total height is not more than 1.1 millimeters. In some embodiments, the total height does not exceed one millimeter. In some embodiments, the total height does not exceed two hundred and fifty micrometers. Similarly, the distance between the bottom of orifice plate 130 and the top of heat-generating structure 102, y, may be small. In some embodiments, y is at least two hundred micrometers and not more than one millimeter. In some embodiments, y is at least two hundred micrometers and not more than three hundred micrometers. Thus, cooling system 100 is usable computing devices and/or other devices having limited space in at least one dimension. However, nothing prevents the use of cooling system 100 in devices having fewer limitations on space and/or for purposes other than cooling. Although one cooling system 100 is shown (e.g. one cooling cell), multiple cooling systems 100 might be used in connection with heat-generating structure 102. For example, a one or two-dimensional array of cooling cells might be utilized.

Cooling system 100 is in communication with a fluid used to cool heat-generating structure 102. The fluid may be a gas or a liquid. For example, the fluid may be air. In some embodiments, the fluid includes fluid from outside of the device in which cooling system 100 resides (e.g. provided through external vents in the device). In some embodiments, the fluid circulates within the device in which cooling system resides (e.g. in an enclosed device).

Cooling element 120 can be considered to divide the interior of active cooling system 100 into top chamber 140 and bottom chamber 150. Top chamber 140 is formed by cooling element 120, the sides, and top plate 110. Bottom chamber 150 is formed by orifice plate 130, the sides, cooling element 120 and anchor 160. Top chamber 140 and bottom chamber 150 are connected at the periphery of cooling element 120 and together form chamber 140/150 (e.g. an interior chamber of cooling system 100).

The size and configuration of top chamber 140 may be a function of the cell (cooling system 100) dimensions, cooling element 120 motion, and the frequency of operation. Top chamber 140 has a height, h1. The height of top chamber 140 may be selected to provide sufficient pressure to drive the fluid to bottom chamber 140 and through orifices 132 at the desired flow rate and/or speed. Top chamber 140 is also sufficiently tall that cooling element 120 does not contact top plate 140 when actuated. In some embodiments, the height of top chamber 140 is at least fifty micrometers and not more than five hundred micrometers. In some embodiments, top chamber 140 has a height of at least two hundred and not more than three hundred micrometers.

Bottom chamber 150 has a height, h2. In some embodiments, the height of bottom chamber 150 is sufficient to accommodate the motion of cooling element 120. Thus, no portion of cooling element 120 contacts orifice plate 130 during normal operation. Bottom chamber 150 is generally smaller than top chamber 140 and may aid in reducing the backflow of fluid into orifices 132. In some embodiments, the height of bottom chamber 150 is the maximum deflection of cooling element 120 plus at least five micrometers and not more than ten micrometers. In some embodiments, the deflection of cooling element 120 (e.g. the deflection of tip 121) has an amplitude of at least ten micrometers and not more than one hundred micrometers. In some such embodiments, the amplitude of deflection of cooling element 120 is at least ten micrometers and not more than sixty micrometers. However, the amplitude of deflection of cooling element 120 depends on factors such as the desired flow rate through cooling system 100 and the configuration of cooling system 100. Thus, the height of bottom chamber 150 generally depends on the flow rate through and other components of cooling system 100.

Top plate 110 includes vent 112 through which fluid may be drawn into cooling system 100. Top vent 112 may have a size chosen based on the desired the acoustic pressure in chamber 140. For example, in some embodiments, the width, w, of vent 112 is at least five hundred micrometers and not more than one thousand micrometers. In some embodiments, the width of vent 112 is at least two hundred fifty micrometers and not more than two thousand micrometers. In the embodiment shown, vent 112 is a centrally located aperture in top plate 110. In other embodiments, vent 112 may be located elsewhere. For example, vent 112 may be closer to one of the edges of top plate 110. Vent 112 may have a circular, rectangular or other shaped footprint. Although a single vent 112 is shown, multiple vents might be used. For example, vents may be offset toward the edges of top chamber 140 or be located on the side(s) of top chamber 140. Although top plate 110 is shown as substantially flat, in some embodiments trenches and/or other structures may be provided in top plate 110 to modify the configuration of top chamber 140 and/or the region above top plate 110.

Anchor (support structure) 160 supports cooling element 120 at the central portion of cooling element 120. Thus, at least part of the perimeter of cooling element 120 is unpinned and free to vibrate. In some embodiments, anchor 160 extends along a central axis of cooling element 120 (e.g. perpendicular to the page in FIGS. 1A-IE). In such embodiments, portions of cooling element 120 that vibrate (e.g. including tip 121) move in a cantilevered fashion. Thus, portions of cooling element 120 may move in a manner analogous to the wings of a butterfly (i.e. in phase) and/or analogous to a seesaw (i.e. out of phase). Thus, the portions of cooling element 120 that vibrate in a cantilevered fashion do so in phase in some embodiments and out of phase in other embodiments. In some embodiments, anchor 160 does not extend along an axis of cooling element 120. In such embodiments, all portions of the perimeter of cooling element 120 are free to vibrate (e.g. analogous to a jellyfish).

In the embodiment shown, anchor 160 supports cooling element 120 from the bottom of cooling element 120. In other embodiments, anchor 160 may support cooling element 120 in another manner. For example, anchor 160 may support cooling element 120 from the top (e.g. cooling element 120 hangs from anchor 160). In some embodiments, the width, a, of anchor 160 is at least 0.5 millimeters and not more than four millimeters. In some embodiments, the width of anchor 160 is at least two millimeters and not more than 2.5 millimeters. Anchor 160 may occupy at least ten percent and not more than fifty percent of cooling element 120.

Cooling element 120 has a first side distal from heat-generating structure 102 and a second side proximate to heat-generating structure 102. In the embodiment shown in FIGS. 1A-1E, the first side of cooling element 120 is the top of cooling element 120 (closer to top plate 110) and the second side is the bottom of cooling element 120 (closer to orifice plate 130). Cooling element 120 is actuated to undergo vibrational motion as shown in FIGS. 1A-IE. The vibrational motion of cooling element 120 drives fluid from the first side of cooling element 120 distal from heat-generating structure 102 (e.g. from top chamber 140) to a second side of cooling element 120 proximate to heat-generating structure 102 (e.g. to bottom chamber 150). The vibrational motion of cooling element 120 also draws fluid through vent 112 and into top chamber 140; forces fluid from top chamber 140 to bottom chamber 150; and drives fluid from bottom chamber 140 through orifices 132 of orifice plate 130.

Cooling element 120 has a length, L, that depends upon the frequency at which cooling element 120 is desired to vibrate. In some embodiments, the length of cooling element 120 is at least four millimeters and not more than ten millimeters. In some such embodiments, cooling element 120 has a length of at least six millimeters and not more than eight millimeters. The depth of cooling element 120 (e.g. perpendicular to the plane shown in FIGS. 1A-1E) may vary from one fourth of L through twice L. For example, cooling element 120 may have the same depth as length. The thickness, t, of cooling element 120 may vary based upon the configuration of cooling element 120 and/or the frequency at which cooling element 120 is desired to be actuated. In some embodiments, the cooling element thickness is at least two hundred micrometers and not more than three hundred and fifty micrometers for cooling element 120 having a length of eight millimeters and driven at a frequency of at least twenty kilohertz and not more than twenty-five kilohertz. The length, C of chamber 140/150 is close to the length, L, of cooling element 120. For example, in some embodiments, the distance, d, between the edge of cooling element 120 and the wall of chamber 140/50 is at least one hundred micrometers and not more than five hundred micrometers. In some embodiments, d is at least two hundred micrometers and not more than three hundred micrometers.

Cooling element 120 may be driven at a frequency that is at or near both the resonant frequency for an acoustic resonance of a pressure wave of the fluid in top chamber 140 and the resonant frequency for a structural resonance of cooling element 120. The portion of cooling element 120 undergoing vibrational motion is driven at or near resonance (the "structural resonance") of cooling element 120. This portion of cooling element 120 undergoing vibration may be a cantilevered section in some embodiments. The frequency of vibration for structural resonance is termed the structural resonant frequency. Use of the structural resonant frequency in driving cooling element 112 reduces the power consumption of cooling system 100. Cooling element 120 and top chamber 140 may also be configured such that this structural resonant frequency corresponds to a resonance in a pressure wave in the fluid being driven through top chamber 140 (the acoustic resonance of top chamber 140). The frequency of such a pressure wave is termed the acoustic resonant frequency. At acoustic resonance, a node in pressure occurs near vent 112 and an antinode in pressure occurs near the periphery of cooling system 100 (e.g. near tip 121 of cooling element 120 and near the connection between top chamber 140 and bottom chamber 150). The distance between these two regions is $C/2$. Thus, $C/2=n\lambda/4$, where $\lambda$ is the acoustic wavelength for the fluid and n is odd (e.g. n=1, 3, 5, etc.). For the lowest order mode, $C=\lambda/2$. Because the length of chamber 140 (e.g. C) is close to the length of cooling element 120, in some embodiments, it is also approximately true that $L/2=n\lambda/4$, where $\lambda$ is the acoustic wavelength for the fluid and n is odd. Thus, the frequency at which cooling element 120 is driven, v, is at or near the structural resonant frequency for cooling element 120. The frequency v is also at or near the acoustic resonant frequency for at least top chamber 140. The acoustic resonant frequency of top chamber 140 generally varies less dramatically with parameters such as temperature and size than the structural resonant frequency of cooling element 120. Consequently, in some embodiments, cooling element 120 may be driven at (or closer to) a structural resonant frequency than to the acoustic resonant frequency.

Orifice plate 130 has orifices 132 therein. Although a particular number and distribution of orifices 132 are shown, another number and/or another distribution may be used. A single orifice plate 130 is used for a single cooling system 100. In other embodiments, multiple cooling systems 100 may share an orifice plate. For example, multiple cells 100 may be provided together in a desired configuration. In such embodiments, the cells 100 may be the same size and configuration or different size(s) and/or configuration(s). Orifices 132 are shown as having an axis oriented normal to a surface of heat-generating structure 102. In other embodiments, the axis of one or more orifices 132 may be at another angle. For example, the angle of the axis may be selected from substantially zero degrees and a nonzero acute angle. Orifices 132 also have sidewalls that are substantially parallel to the normal to the surface of orifice plate 130. In some, orifices may have sidewalls at a nonzero angle to the normal to the surface of orifice plate 130. For example, orifices 132 may be cone-shaped. Further, although orifice place 130 is shown as substantially flat, in some embodiments, trenches and/or other structures may be provided in orifice plate 130 to modify the configuration of bottom chamber 150 and/or the region between orifice plate 130 and heat-generating structure 102.

The size, distribution and locations of orifices 132 are chosen to control the flow rate of fluid driven to the surface of heat-generating structure 102. The locations and configurations of orifices 132 may be configured to increase/maximize the fluid flow from bottom chamber 150 through orifices 132 to the jet channel (the region between the bottom of orifice plate 130 and the top of heat-generating structure 102). The locations and configurations of orifices 132 may also be selected to reduce/minimize the suction flow (e.g. back flow) from the jet channel through orifices 132. For example, the locations of orifices are desired to be sufficiently far from tip 121 that suction in the upstroke of cooling element 120 (tip 121 moves away from orifice plate 13) that would pull fluid into bottom chamber 150 through orifices 132 is reduced. The locations of orifices are also desired to be sufficiently close to tip 121 that suction in the upstroke of cooling element 120 also allows a higher pressure from top chamber 140 to push fluid from top chamber 140 into bottom chamber 150. In some embodiments, the ratio of the flow rate from top chamber 140 into bottom chamber 150 to the flow rate from the jet channel through orifices 132 in the upstroke (the "net flow ratio") is greater than 2:1. In some embodiments, the net flow ratio is at least 85:15. In some embodiments, the net flow ratio is at least 90:10. In order to provide the desired pressure, flow rate, suction, and net flow ratio, orifices 132 are desired to be at least a distance, r1, from tip 121 and not more than a distance, r2, from tip 121 of cooling element 120. In some embodiments r1 is at least one hundred micrometers (e.g. $r1 \geq 100$ μm) and r2 is not more than one millimeter (e.g. $r2 \leq 1000$ μm). In some embodiments, orifices 132 are at least two hundred micrometers from tip 121 of cooling element 120 (e.g. $r1 \geq 200$ μm). In some such embodiments, orifices 132 are at least three hundred micrometers from tip 121 of cooling element 120 (e.g. $r1 \geq 300$ μm). In some embodiments, orifices 132 have a width of at least one hundred micrometers and not more than five hundred micrometers. In some embodiments, orifices 132 have a width of at least two hundred micrometers and not more than three hundred micrometers. In some embodiments, the orifice separation, s, is at least one hundred micrometers and not more than one millimeter. In some such embodiments, the orifice separation is at least four hundred micrometers and not more than six hundred micrometers. In some embodiments, orifices 132 are also desired to occupy a particular fraction of the area of orifice plate 130. For example, orifices 132 may cover at least five percent and not more than fifteen percent of the footprint of orifice plate 130 in order to achieve a desired flow rate of fluid through orifices 132. In some embodiments, orifices 132 cover at least eight percent and not more than twelve percent of the footprint of orifice plate 130.

In some embodiments, cooling element 120 is actuated using a piezoelectric. Thus, cooling element 120 may be a piezoelectric cooling element. Cooling element 120 may be driven by a piezoelectric that is mounted on or integrated into cooling element 120. In some embodiments, cooling element 120 is driven in another manner including but not limited to providing a piezoelectric on another structure in cooling system 100. Cooling element 120 and analogous cooling elements are referred to hereinafter as piezoelectric cooling element though it is possible that a mechanism other than a piezoelectric might be used to drive the cooling element. In some embodiments, cooling element 120 includes a piezoelectric layer on substrate. The substrate may be a stainless steel, Ni alloy and/or Hastelloy substrate. In some embodiments, piezoelectric layer includes multiple sublayers formed as thin films on the substrate. In other embodiments, the piezoelectric layer may be a bulk layer affixed to the substrate. Such a piezoelectric cooling element 120 also includes electrodes used to activate the piezoelectric. The substrate functions as an electrode in some embodiments. In other embodiments, a bottom electrode may be provided between the substrate and the piezoelectric layer. Other layers including but not limited to seed, capping, passivation or other layers might be included in piezoelectric cooling element. Thus, cooling element 120 may be actuated using a piezoelectric.

In some embodiments, cooling system 100 includes chimneys (not shown) or other ducting. Such ducting provides a path for heated fluid to flow away from heat-generating structure 102. In some embodiments, ducting returns fluid to the side of top plate 110 distal from heat-generating structure 102. In some embodiments, ducting may instead directed fluid away from heat-generating structure 102 in a direction parallel to heat-generating structure 102 or perpendicular to heat-generating structure 102 but in the opposite direction (e.g. toward the bottom of the page). For a device in which fluid external to the device is used in cooling system 100, the ducting may channel the heated fluid to a vent. In such embodiments, additional fluid may be provided from an inlet vent. In embodiments, in which the device is enclosed, the ducting may provide a circuitous path back to the region near vent 112 and distal from heat-generating structure 102. Such a path allows for the fluid to dissipate heat before being reused to cool heat-generating structure 102. In other embodiments, ducting may be omitted or configured in another manner. Thus, the fluid is allowed to carry away heat from heat-generating structure 102.

Figure 1B:
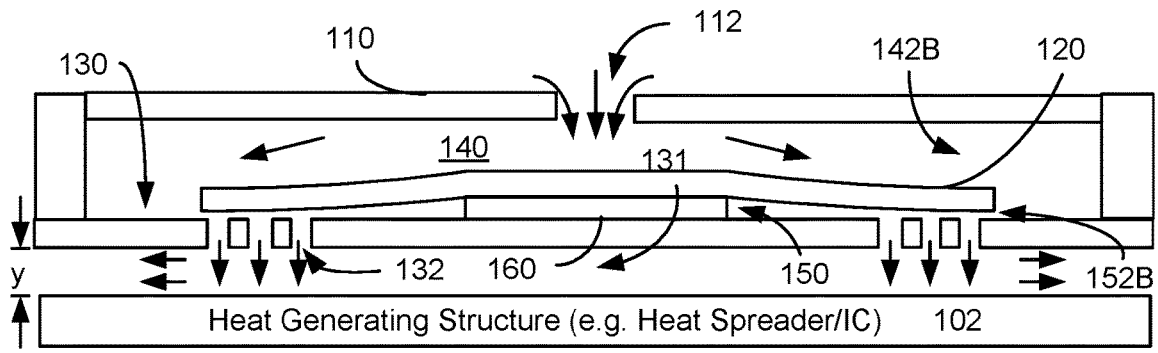
Figure 1C:
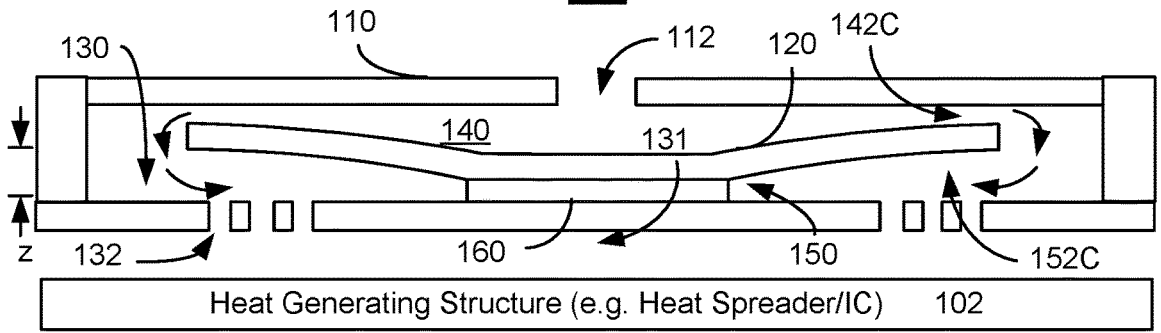

Operation of cooling system 100 is described in the context of FIGS. 1A-1E. Although described in the context of particular pressures, gap sizes, and timing of flow, operation of cooling system 100 is not dependent upon the explanation herein. FIGS. 1B-1C depict in-phase operation of cooling system 100. Referring to FIG. 1B, cooling element 120 has been actuated so that its tip 121 moves away from top plate 110. FIG. 1B can thus be considered to depict the end of a down stroke of cooling element 120. Because of the vibrational motion of cooling element 120, gap 152 for bottom chamber 150 has decreased in size and is shown as gap 152B. Conversely, gap 142 for top chamber 140 has increased in size and is shown as gap 142B. During the down stroke, a lower (e.g. minimum) pressure is developed at the periphery when cooling element 120 is at the neutral position. As the down stroke continues, bottom chamber 150 decreases in size and top chamber 140 increases in size as shown in FIG. 1B. Thus, fluid is driven out of orifices 132 in a direction that is at or near perpendicular to the surface of orifice plate 130 and/or the top surface of heat-generating structure 102. The fluid is driven from orifices 132 toward heat-generating structure 102 at a high speed, for example in excess of thirty-five meters per second. In some embodiments, the fluid then travels along the surface of heat-generating structure 102 and toward the periphery of heat-generating structure 102, where the pressure is lower than near orifices 132. Also in the down stroke, top chamber 140 increases in size and a lower pressure is present in top chamber 140. As a result, fluid is drawn into top chamber 140 through vent 112. The motion of the fluid into vent 112, through orifices 132, and along the surface of heat-generating structure 102 is shown by unlabeled arrows in FIG. 1B. Cooling element 120 is also actuated so that top 121 moves away from heat-generating structure 102 and toward top plate 110. FIG. 1C can thus be considered to depict the end of an up stroke of cooling element 120. Because of the motion of cooling element 120, gap 142 has decreased in size and is shown as gap 142C. Gap 152 has increased in size and is shown as gap 152C. During the upstroke, a higher (e.g. maximum) pressure is developed at the periphery when cooling element 120 is at the neutral position. As the upstroke continues, bottom chamber 150 increases in size and top chamber 140 decreases in size as shown in FIG. 1C. Thus, the fluid is driven from top chamber 140 (e.g. the periphery of chamber 140/150) to bottom chamber 150. Thus, when tip 121 of cooling element 120 moves up, top chamber 140 serves as a nozzle for the entering fluid to speed up and be driven towards bottom chamber 150. The motion of the fluid into bottom chamber 150 is shown by unlabeled arrows in FIG. 1C. The location and configuration of cooling element 120 and orifices 132 are selected to reduce suction and, therefore, back flow of fluid from the jet channel (between heat-generating structure 102 and orifice plate 130) into orifices 132 during the upstroke. Thus, cooling system 100 is able to drive fluid from top chamber 140 to bottom chamber 150 without an undue amount of backflow of heated fluid from the jet channel entering bottom chamber 10.

The motion between the positions shown in FIGS. 1B and 1C is repeated. Thus, cooling element 120 undergoes vibrational motion indicated in FIGS. 1A-1C, drawing fluid through vent 112 from the distal side of top plate 110 into top chamber 140; transferring fluid from top chamber 140 to bottom chamber 150; and pushing the fluid through orifices 132 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at frequencies from 15 kHz through 30 kHz. In some embodiments, cooling element 120 vibrates at a frequency/frequencies of at least 20 kHz and not more than 30 kHz. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 may move substantially normal (perpendicular) to the top surface of heat-generating structure 102. In some embodiments, the fluid motion may have a nonzero acute angle with respect to the normal to the top surface of heat-generating structure 102. In either case, the fluid may thin and/or form apertures in the boundary layer of fluid at heat-generating structure 102. As a result, transfer of heat from heat-generating structure 102 may be improved. The fluid deflects off of heat-generating structure 102, traveling along the surface of heat-generating structure 102. In some embodiments, the fluid moves in a direction substantially parallel to the top of heat-generating structure 102. Thus, heat from heat-generating structure 102 may be extracted by the fluid. The fluid may exit the region between orifice plate 130 and heat-generating structure 102 at the edges of cooling system 100. Chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 110. As a result, heat-generating structure 102 may be cooled.

Figure 1D:
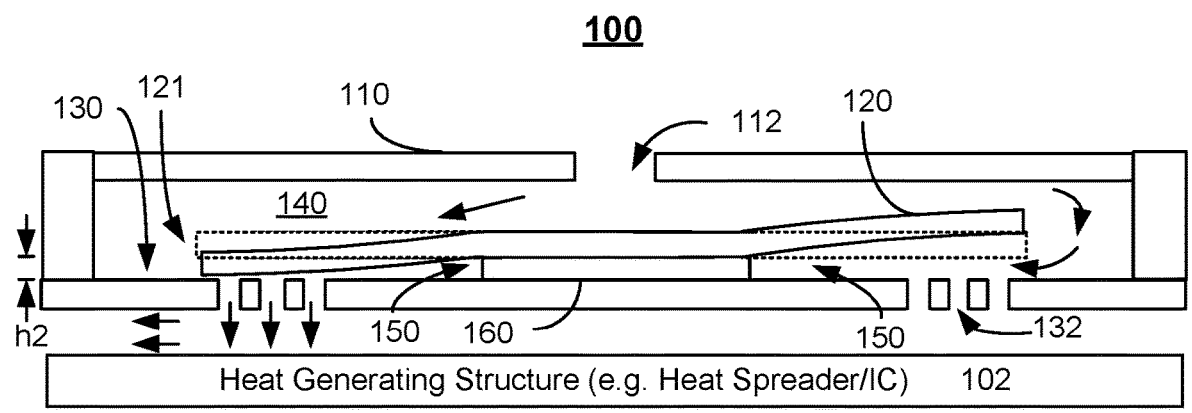
Figure 1E:
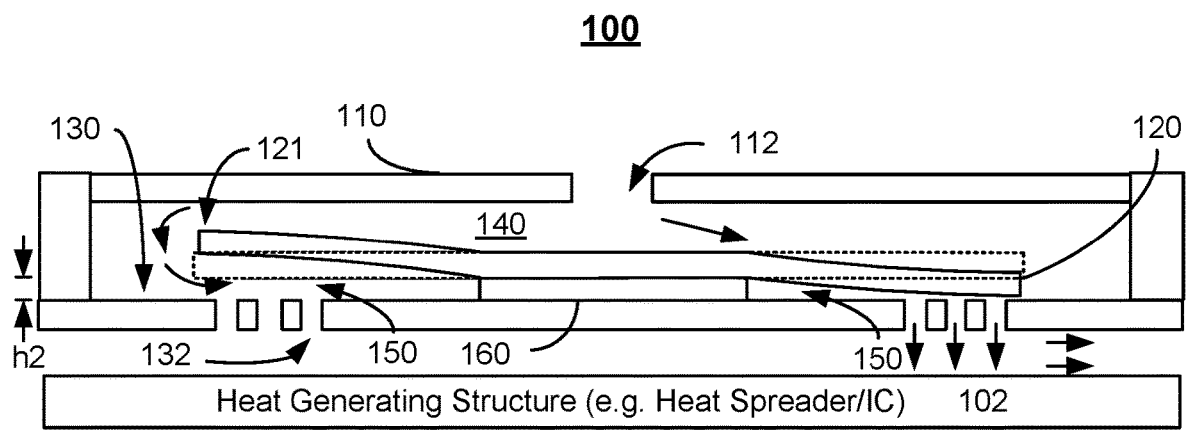

FIGS. 1D-1E depict an embodiment of active cooling system 100 including centrally anchored cooling element 120 in which the cooling element is driven out-of-phase.

More specifically, sections of cooling element 120 on opposite sides of anchor 160 (and thus on opposite sides of the central region of cooling element 120 that is supported by anchor 160) are driven to vibrate out-of-phase. In some embodiments, sections of cooling element 120 on opposite sides of anchor 160 are driven at or near one hundred and eighty degrees out-of-phase. Thus, one section of cooling element 120 vibrates toward top plate 110, while the other section of cooling element 120 vibrates toward orifice plate 130/heat-generating structure 102. Movement of a section of cooling element 120 toward top plate 110 (an upstroke) drives fluid in top cavity 140 to bottom cavity 150 on that side of anchor 160. Movement of a section of cooling element 120 toward orifice plate 130 drives fluid through orifices 132 and toward heat-generating structure 102. Thus, fluid traveling at high speeds (e.g. speeds described with respect to in-phase operation) is alternately driven out of orifices 132 on opposing sides of anchor 160. The movement of fluid is shown by unlabeled arrows in FIGS. 1D and 1E.

The motion between the positions shown in FIGS. 1D and 1E is repeated. Thus, cooling element 120 undergoes vibrational motion indicated in FIGS. 1A, 1D, and 1E, alternately drawing fluid through vent 112 from the distal side of top plate 110 into top chamber 140 for each side of cooling element 120; transferring fluid from each side of top chamber 140 to the corresponding side of bottom chamber 150; and pushing the fluid through orifices 132 on each side of anchor 160 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at the frequencies described for in-phase vibration. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 for out-of-phase vibration may move substantially normal (perpendicular) to the top surface of heat-generating structure 102, in a manner analogous to that described above for in-phase operation. Similarly, chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 110. As a result, heat-generating structure 102 may be cooled.

Using the cooling system 100 actuated for in-phase vibration or out-of-phase vibration, fluid drawn in through vent 112 and driven through orifices 132 may efficiently dissipate heat from heat-generating structure 102. Because fluid impinges upon the heat-generating structure with sufficient speed (e.g. at least thirty meters per second) and in some embodiments substantially normal to the heat-generating structure, the boundary layer of fluid at the heat-generating structure may be thinned and/or partially removed. Consequently, heat transfer between heat-generating structure 102 and the moving fluid is improved. Because the heat-generating structure is more efficiently cooled, the corresponding integrated circuit may be run at higher speed and/or power for longer times. For example, if the heat-generating structure corresponds to a high-speed processor, such a processor may be run for longer times before throttling. Thus, performance of a device utilizing cooling system 100 may be improved. Further, cooling system 100 may be a MEMS device. Consequently, cooling systems 100 may be suitable for use in smaller and/or mobile devices, such as smart phones, other mobile phones, virtual reality headsets, tablets, two-in-one computers, wearables and handheld games, in which limited space is available. Performance of such devices may thus be improved. Because cooling element 120 may be vibrated at frequencies of 15 kHz or more, users may not hear any noise associated with actuation of cooling elements. If driven at or near structural and/or acoustic resonant frequencies, the power used in operating cooling systems may be significantly reduced. Cooling element 120 does not physically contact top plate 110 or orifice plate 130 during vibration. Thus, resonance of cooling element 120 may be more readily maintained. More specifically, physical contact between cooling element 120 and other structures disturbs the resonance conditions for cooling element 120. Disturbing these conditions may drive cooling element 120 out of resonance. Thus, additional power would need to be used to maintain actuation of cooling element 120. Further, the flow of fluid driven by cooling element 120 may decrease. These, issues are avoided through the use of pressure differentials and fluid flow as discussed above. The benefits of improved, quiet cooling may be achieved with limited additional power. Further, out-of-phase vibration of cooling element 120 allows the position of the center of mass of cooling element 100 to remain more stable. Although a torque is exerted on cooling element 120, the force due to the motion of the center of mass is reduced or eliminated. As a result, vibrations due to the motion of cooling element 120 may be reduced. Moreover, efficiency of cooling system 100 may be improved through the use of out-of-phase vibrational motion for the two sides of cooling element 120. Consequently, performance of devices incorporating the cooling system 100 may be improved. Further, cooling system 100 may be usable in other applications (e.g. with or without heat-generating structure 102) in which high fluid flows and/or velocities are desired.

Figure 2A:
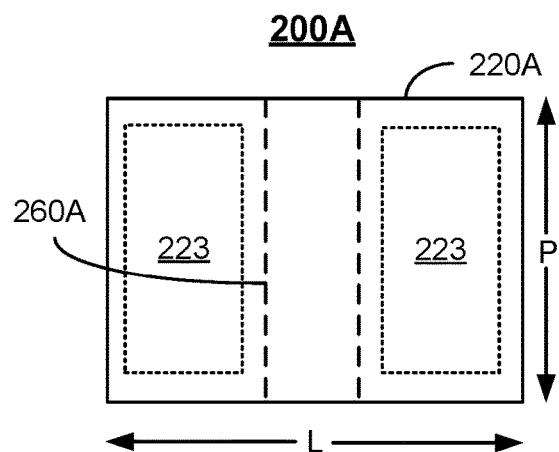
FIGS. 2A-2B depict embodiments of cooling elements usable in active cooling systems including centrally anchored cooling elements.
Figure 2B:
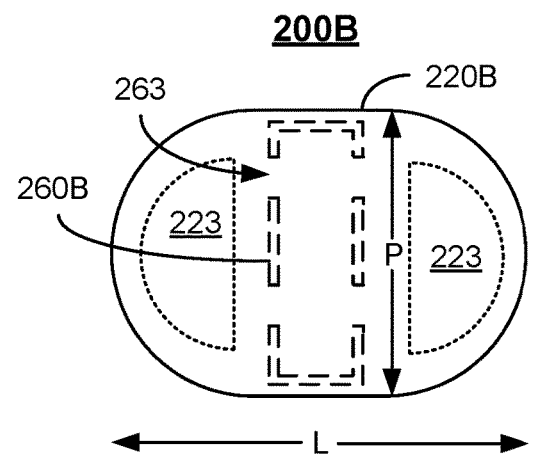

FIGS. 2A-2B depict plan views of embodiments of cooling systems 200A and 200B analogous to active cooling systems such as cooling system 100. FIGS. 2A and 2B are not to scale. For simplicity, only portions of cooling elements 220A and 220B and anchors 260A and 260B, respectively, are shown. Cooling elements 220A and 220B are analogous to cooling element 120. Thus, the sizes and/or materials used for cooling elements 220A and/or 220B may be analogous to those for cooling element 120. Anchors (support structures) 260A and 260B are analogous to anchor 160 and are indicated by dashed lines.

For cooling elements 220A and 220B, anchors 260A and 260B are centrally located and extend along a central axis of cooling elements 220A and 220B, respectively. Thus, the cantilevered portions that are actuated to vibrate are to the right and left of anchors 260A and 260B. In some embodiments, cooling element(s) 220A and/or 220B are continuous structures, two portions of which are actuated (e.g. the cantilevered portions outside of anchors 260A and 260B). In some embodiments, cooling element(s) 220A and/or 220B include separate cantilevered portions each of which is attached to the anchors 260A and 260B, respectively, and actuated. Cantilevered portions of cooling elements 220A and 220B may thus be configured to vibrate in a manner analogous to the wings of a butterfly (in-phase) or to a seesaw (out-of-phase). In FIGS. 2A and 2B, L is the length of the cooling element, analogous to that depicted in FIGS. 1A-IE. Also in FIGS. 2A and 2B, the depth, P, of cooling elements 220A and 220B is indicated.

Also shown by dotted lines in FIGS. 2A-2B are piezoelectric 223. Piezoelectric 223 is used to actuate cooling elements 220A and 220B. In some embodiments, piezoelectric 223 may be located in another region and/or have a different configuration. Although described in the context of a piezoelectric, another mechanism for actuating cooling elements 260A and 260B can be utilized. Such other mechanisms may be at the locations of piezoelectric 223 or may be located elsewhere. In cooling element 260A, piezoelectric 223 may be affixed to cantilevered portions or may be integrated into cooling element 220A. Further, although piezoelectric 223 is shown as having particular shapes and sizes in FIGS. 2A and 2B, other configurations may be used.

In the embodiment shown in FIG. 2A, anchor 260A extends the entire depth of cooling element 220A. Thus, a portion of the perimeter of cooling element 260A is pinned. The unpinned portions of the perimeter of cooling element 260A are part of the cantilevered sections that undergo vibrational motion. In other embodiments, anchor need not extend the entire length of the central axis. In such embodiments, the entire perimeter of the cooling element is unpinned. However, such a cooling element still has cantilevered sections configured to vibrate in a manner described herein. For example, in FIG. 2B, anchor 260B does not extend to the perimeter of cooling element 220B. Thus, the perimeter of cooling element 220B is unpinned. However, anchor 260B still extends along the central axis of cooling element 220B. Cooling element 220B is still actuated such that cantilevered portions vibrate (e.g. analogous to the wings of a butterfly).

Although cooling element 220 A is depicted as rectangular, cooling elements may have another shape. In some embodiments, corners of cooling element 220A may be rounded. Cooling element 220B of FIG. 2B has rounded cantilevered sections. Other shapes are possible. In the embodiment shown in FIG. 2B, anchor 260B is hollow and includes apertures 263. In some embodiments, cooling element 220B has aperture(s) in the region of anchor 260B. In some embodiments, cooling element 220B includes multiple portions such that aperture(s) exist in the region of anchor 260B. As a result, fluid may be drawn through cooling element 220B and through anchor 260B. Thus, cooling element 220B may be used in place of a top plate, such as top plate 110. In such embodiments, apertures in cooling element 220B and apertures 263 may function in an analogous manner to vent 112. Further, although cooling elements 200A and 200B are depicted as being supported in a central region, in some embodiments, one cantilevered section of the cooling element 220A and/or 220B might be omitted. In such embodiments, cooling element 220A and/or 220B may be considered to be supported, or anchored, at or near one edge, while at least part of at least the opposing edge is free to undergo vibrational motion. In some such embodiments, the cooling element 220A and/or 220B may include a single cantilevered section that undergoes vibrational motion.

Figure 3A:
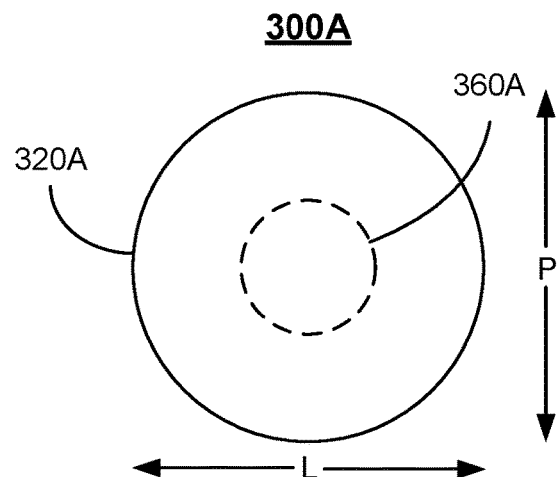
FIGS. 3A-3B depict embodiments of cooling elements usable in active cooling systems including centrally anchored cooling elements.
Figure 3B:
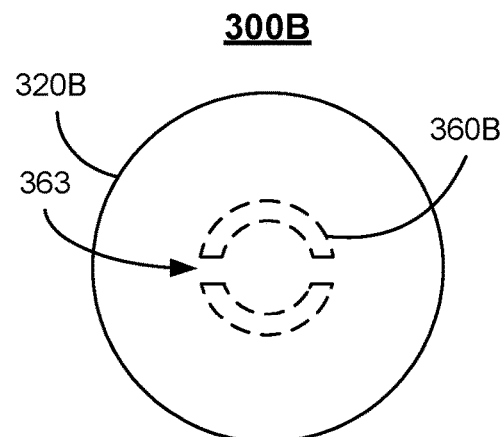

FIGS. 3A-3B depict plan views of embodiments of cooling systems 300A and 300B analogous to active cooling systems such as cooling system 100. FIGS. 3A and 3B are not to scale. For simplicity, only cooling elements 320A and 320B and anchors 360A and 360B, respectively, are shown. Cooling elements 320A and 320B are analogous to cooling element 120. Thus, the sizes and/or materials used for cooling elements 320A and/or 320B may be analogous to those for cooling element 120. Anchors 360A and 360B are analogous to anchor 160 and are indicated by dashed lines.

For cooling elements 320A and 320B, anchors 360A and 360B, respectively, are limited to a central region of cooling elements 320A and 320B, respectively. Thus, the regions surrounding anchors 360A and 360B undergo vibrational motion. Cooling elements 320A and 320B may thus be configured to vibrate in a manner analogous to a jellyfish or similar to the opening/closing of an umbrella. In some embodiments, the entire perimeter of cooling elements 320A and 320B vibrate in phase (e.g. all move up or down together). In other embodiments, portions of the perimeter of cooling elements 320A and 320B vibrate out of phase. In FIGS. 3A and 3B, L is the length (e.g. diameter) of the cooling element, analogous to that depicted in FIGS. 1A-IE. Although cooling elements 320A and 320B are depicted as circular, cooling elements may have another shape. Further, a piezoelectric (not shown in FIGS. 3A-3B) and/or other mechanism may be used to drive the vibrational motion of cooling elements 320A and 320B.

In the embodiment shown in FIG. 3B, the anchor 360B is hollow and has apertures 363. In some embodiments, cooling element 320B has aperture(s) in the region of anchor 360B. In some embodiments, cooling element 320B includes multiple portions such that aperture(s) exist in the region of anchor 360B. As a result, fluid may be drawn through cooling element 320B and through anchor 360B. The fluid may exit through apertures 363. Thus, cooling element 320B may be used in place of a top plate, such as top plate 110. In such embodiments, apertures in cooling element 320B and apertures 363 may function in an analogous manner to vent 112.

Cooling systems such as cooling system 100 can utilize cooling element(s) 220A, 220B, 320A, 320B and/or analogous cooling elements. Such cooling systems may also share the benefits of cooling system 100. Cooling systems using cooling element(s) 220A, 220B, 320A, 320B and/or analogous cooling elements may more efficiently drive fluid toward heat-generating structures at high speeds. Consequently, heat transfer between the heat-generating structure and the moving fluid is improved. Because the heat-generating structure is more efficiently cooled, the corresponding device may exhibit improved operation, such as running at higher speed and/or power for longer times. Cooling systems employing cooling element(s) 220A, 220B, 320A, 320B and/or analogous cooling elements may be suitable for use in smaller and/or mobile devices in which limited space is available. Performance of such devices may thus be improved. Because cooling element(s) 220A, 220B, 320A, 320B and/or analogous cooling elements may be vibrated at frequencies of 15 kHz or more, users may not hear any noise associated with actuation of cooling elements. If driven at or near the acoustic and/or structural resonance frequencies for the cooling element(s) 220A, 220B, 320A, 320B and/or analogous cooling elements, the power used in operating cooling systems may be significantly reduced. Cooling element(s) 220A, 220B, 320A, 320B and/or analogous cooling elements may not physically contact the plates during use, allowing resonance to be more readily maintained. The benefits of improved, quiet cooling may be achieved with limited additional power. Consequently, performance of devices incorporating the cooling element(s) 220A, 220B, 320A, 320B and/or analogous cooling elements may be improved.

In some embodiments, the cooling element may be anchored at one or more edges instead of at its center. For example, FIGS. 4A-4C depict an embodiment of cooling system 400 in which the edges of the cooling elements are anchored.

Figure 4A:
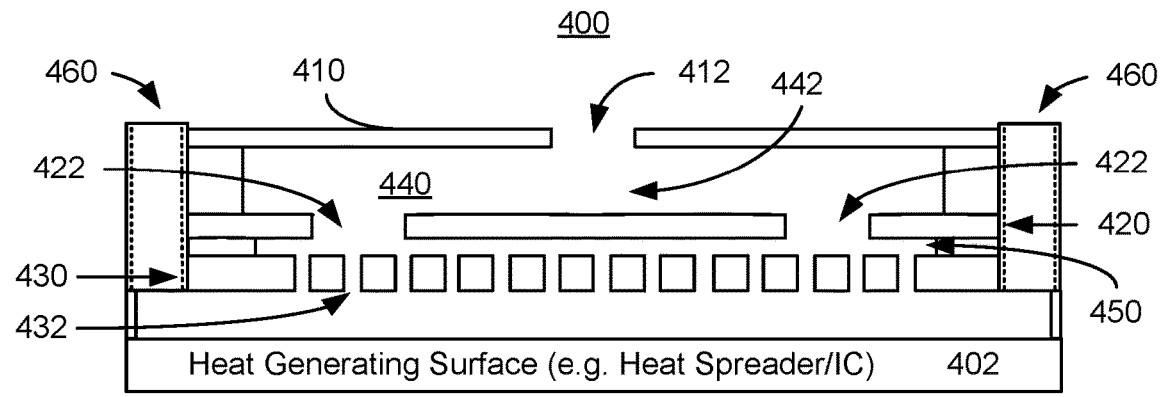
FIGS. 4A-4C are diagrams depicting an embodiment of an active cooling system.
Figure 4B:
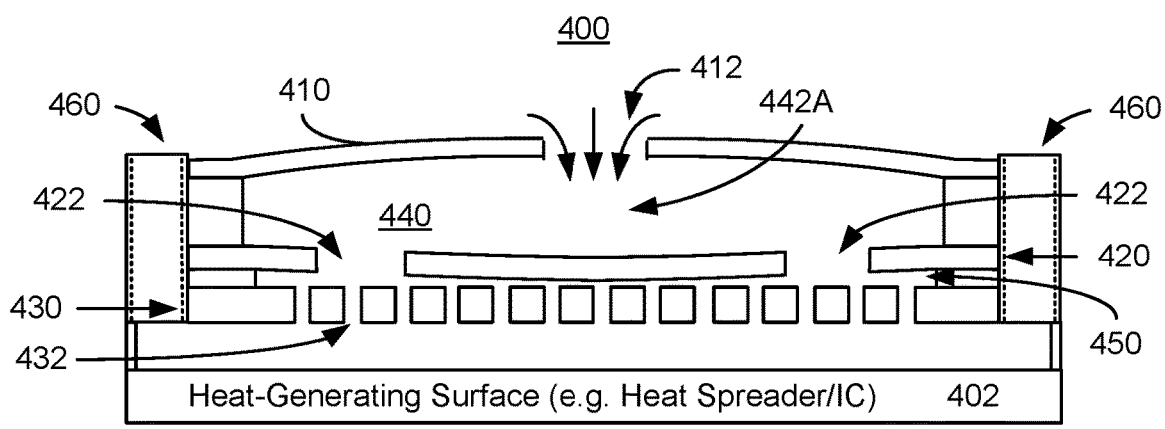
Figure 4C:
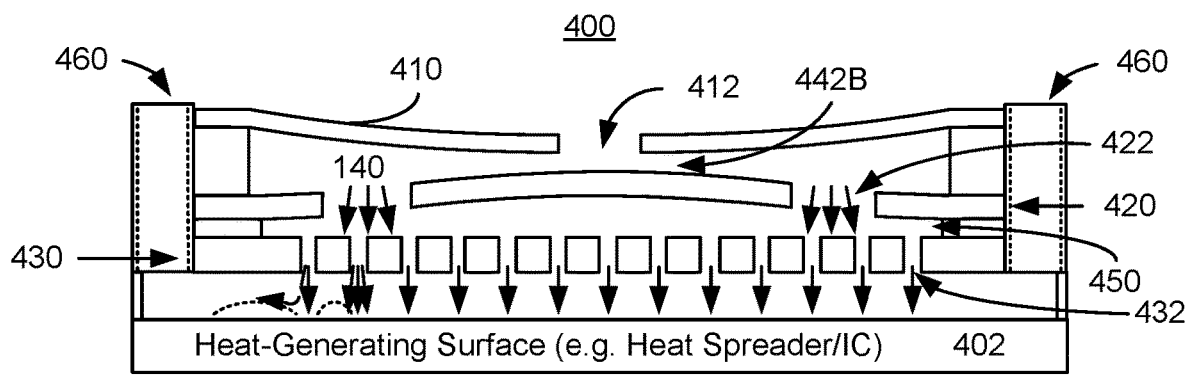

FIGS. 4A-4C are diagrams depicting an exemplary embodiment of active cooling system 400 usable with a heat-generating structure 402. For clarity, only certain components are shown and FIGS. 4A-4C are not to scale. Cooling system 400 is used in connection with a heat-generating structure 402. Although shown as symmetric, cooling system 400 need not be symmetric.

Cooling system 400 includes cooling elements 410 and 420. Cooling system 400 also includes orifice plate 430 having orifices 432 therein, top chamber 440 and bottom chamber 450 that may be analogous to orifice plate 130 having orifices 132 therein, top chamber 140 and bottom chamber 150. Also shown are optional chimneys 460 used to direct fluid.

Cooling element 410 has a first side distal from heat-generating structure 402 and a second side proximate to heat-generating structure 402. The first side of cooling element 410 is the top of cooling element 410 and the second side is the bottom of cooling element 410. Cooling element 410 also has a passive vent 412 therein. In the embodiment shown, passive vent 412 is a centrally located aperture in cooling element 410. In other embodiments, passive vent 412 may be located elsewhere. For example, passive vent 412 may be closer to one of the edges of cooling element 410. Passive vent 412 may have a circular, rectangular or other shaped footprint. Although one passive vent 412 is shown, multiple passive vents might be used.

Cooling element 420 is between cooling element 410 and heat-generating structure 402. In the embodiment shown, cooling element 420 is also between cooling element 410 and orifice plate 430. Cooling elements 410 and 420 are separated by gap 442 and form a top chamber 440. A bottom chamber 450 is formed between cooling element 420 and orifice plate 430. Cooling element 420 also has active vents 422 therein. In the embodiment shown, active vents 422 are apertures located away from the central region of cooling element 420. In other embodiments, active vents 422 may be located elsewhere. For example, an active vent may be centrally located in cooling element 420. Although two active vents 422 are shown, another number (e.g. one, three, etc.) might be present. In some embodiments, active vents 422 are positioned such that the active vents 422 are not aligned with passive vent 412. Active vents 422 may have circular, rectangular or other shaped footprints. In some embodiments, a single cooling element 410 or 420 which does not include a vent may be used in lieu of two cooling elements.

In some embodiments, cooling system 400 includes chimneys 460. Chimneys 460 provide a return path for heated fluid to flow away from heat-generating structure 402. In some embodiments, chimneys 460 return fluid to the side of cooling element 410 distal from heat-generating structure 402. In the embodiment shown, chimneys 460 direct heated fluid substantially perpendicular to heat-generating structure 402 and toward the side of cooling element 410 distal from heat-generating structure 402. In other embodiments, chimneys 460 may be omitted or configured in another manner. For example, chimneys may instead directed fluid away from heat-generating structure 402 in a direction parallel to heat-generating structure 402 or perpendicular to heat-generating structure 402 but opposite to the direction shown (e.g. toward the bottom of the page). If multiple cooling systems 400 are provided in an array, each cooling system 400 may include chimneys, only cooling systems 400 at the edges may include chimneys, other ducting may be provided at the edges or other locations in the array to provide a path for heated fluid to flow and/or other mechanisms may be used to allow heated fluid to be removed from the region proximate to heat-generating structure 402.

FIG. 4A depicts cooling system 400 in a neutral position. Thus, cooling elements 410 and 420 are shown as substantially flat. In operation, piezoelectric cooling elements 410 and 420 are actuated to vibrate between positions shown in FIGS. 4B and 4C. Piezoelectric cooling elements 410 and 420 are, therefore, piezoelectric actuators. Operation of cooling system 400 is described in the context of FIGS. 4B and 4C. Referring to FIG. 4B, piezoelectric cooling element 410 has been actuated to move away from (deform to be convex) heat-generating structure 402, while piezoelectric cooling element 420 has been actuated to move toward (deform to be concave) heat-generating structure 402. This configuration is referred to as the suction arrangement. Because of the vibrational motion of piezoelectric cooling elements 410 and 420, gap 442 has increased in size and is shown as gap 442A. For example, in some embodiments, gap 442 has a height of at least ten and not more than twenty micrometers in the neutral position (FIG. 4A). Gap 442A may have a height of at least twenty and not more than thirty micrometers in the suction arrangement (FIG. 4B). Thus, top chamber 440 has increased in volume, while bottom chamber 450 has decreased in volume. In the suction arrangement, the flow resistance of passive vent 412 (passive suction flow resistance) is low. Consequently, the pressure at passive vent 412 is low. In contrast, the flow resistance of active vent 422 (active suction flow resistance) is high. Consequently, the pressure at active vent 422 is high. Because of the low passive suction flow resistance, fluid is drawn into top chamber 440 through passive vent 412. This is shown by arrows in FIG. 4B. However, fluid does not flow out of (or flows out to a limited extent) active vent 422 because of the high passive suction flow resistance. However, active vent 422 is not physically closed in this configuration. For example, active vent 422 is not in contact with orifice plate 430 in the suction arrangement.

FIG. 4C depicts an expulsion arrangement. Piezoelectric cooling element 410 has been actuated to move toward (deform to be concave) heat-generating structure 402, while piezoelectric cooling element 420 has been actuated to move away from (deform to be convex) heat-generating structure 402. Because of the vibrational motion of piezoelectric cooling elements 410 and 420, gap 442 has decreased in size and is shown as gap 442B. For example, in some embodiments, gap 442 has a height of at least ten and not more than twenty micrometers in the neutral position (FIG. 4A). Gap 442B has a height of at least five and not more than ten micrometers in the expulsion arrangement (FIG. 4C). Thus, top chamber 440 has decreased in volume, while bottom chamber 450 has increased in volume. In the expulsion arrangement, the flow resistance of passive vent 412 (passive expulsion flow resistance) is high. Consequently, the pressure at passive vent 412 is high. In contrast, the flow resistance of active vent 422 (active expulsion flow resistance) is low. Consequently, the pressure at active vent 422 is low. Because of the low active expulsion flow resistance, fluid is expelled from top chamber 440 through active vent 422, into bottom chamber 450 and through orifices 432. This is shown by arrows in FIG. 4C. However, fluid does not flow out of (or flows out to a limited extent) passive vent 412 because of the high passive expulsion flow resistance. Thus, passive vent 412 is considered closed and active vent 422 is considered open in the expulsion arrangement. However passive vent 412 is not physically closed in this configuration. For example, passive vent 412 is not in contact with cooling element 420 in the expulsion arrangement. Gap 442B does not have a zero length.

Virtual valves may be considered to be formed at or near active vent 422 and passive vent 412. A virtual valve has a high, but not infinite, flow resistance when closed. Thus, a virtual valve does not physically block flow but instead uses a high flow resistance or high pressure to throttle or prevent flow. A virtual valve has a significantly lower flow resistance or pressure when open, allowing flow. In some embodiments, the ratio of flow resistances or pressures between closed and open for a virtual valve is at least three and not more than ten. Thus, active vent 422 and its virtual valve ("active virtual valve") are considered closed in the suction arrangement because the flow resistance is sufficiently high that little or no fluid flows through active vent 422 in the suction arrangement. Passive vent 412 and its virtual valve ("passive virtual valve") are considered open in the suction arrangement because the pressure or flow resistance is sufficiently low to allow fluid to be drawn in to top chamber 440 through passive vent 412. In contrast, active vent 422 and active virtual valve are considered open in the expulsion arrangement because the pressure or flow resistance is sufficiently low to allow fluid to flow through active vent 422 and be driven out of orifices 432. Passive vent 412 and passive virtual valve are considered closed in the expulsion arrangement because the pressure or flow resistance is sufficiently high that little to no fluid is drawn through passive vent 412 in the expulsion arrangement.

Due to the vibrational motion of cooling elements 410 and 420 (and the attendant decrease in gap 442A/442B from FIG. 4B to FIG. 4C), the fluid is drawn in to top chamber 440 and through orifices 432. The motion of the fluid is shown by arrows through orifices 432. The fluid may spread as it travels away from orifice plate 420, as shown by dashed lines and arrows for some orifices 432 in FIG. 4C. The fluid deflects off of heat-generating structure 402 and travels along the channel between heat-generating structure 402 and orifice plate 430.

The motion between the positions shown in FIGS. 4B and 4C may be repeated. Thus, piezoelectric cooling elements 410 and 420 vibrate, drawing fluid through passive vent 412 from the distal side of cooling element 410, into top chamber 440, out of chamber 440 through active vent 422 and pushing the fluid through orifices 432 and toward heat-generating structure 402. In some embodiments, the frequency/frequencies of vibration of cooling elements 410 and/or 420 are analogous to those of cooling element 120. Further, in some embodiments, piezoelectric cooling element(s) 410 and/or 420 may be driven at or near the resonant frequency. The resonant frequencies of piezoelectric cooling element(s) 410 and 420 may also be desired to be close. In some embodiments, the resonant frequencies of piezoelectric cooling element(s) 410 and 420 are desired to be within one hundred Hertz. In some embodiments, feedback is used to maintain piezoelectric cooling element(s) 410 and/or 420 at or near resonance. In some embodiments, the resonant frequencies of cooling elements 410 and/or 420 are closely matched to the acoustic resonant frequencies of chamber(s) 440 and/or 450. In some embodiments, the speed at which the fluid impinges on heat-generating structure 402 is in the ranges described herein for cooling system 100.

As indicated in FIG. 4C, the fluid driven toward heat-generating structure 402 may move substantially normal (perpendicular) to the top surface of heat-generating structure 402. In other embodiments, the fluid motion may have a nonzero acute angle with respect to the normal to the top surface of heat-generating structure 402. In either case, the fluid may thin and/or form apertures in the boundary layer of fluid at heat-generating structure 402. The boundary layer in one case is indicated by the curved dotted lines at the top surface of heat-generating structure 402 in FIG. 4C. As a result, transfer of heat from heat-generating structure 402 may be improved. The fluid deflects off of heat-generating structure 402, traveling along the surface of heat-generating structure 402. In some embodiments, the fluid moves in a direction substantially parallel to the top of heat-generating structure 402. Thus, heat from heat-generating structure 402 may be extracted by the fluid. The fluid may exit the region between orifice plate 430 and heat-generating structure 402 at the edges of cooling system 400. In the embodiment shown, chimneys 460 at the edges of cooling system 400 allow fluid to be carried away from heat-generating structure 402. In other embodiments, heated fluid may be transferred further from heat-generating structure 402 in another manner. The fluid may return to the distal side of cooling elements 410 where the fluid may exchange the heat transferred from heat-generating structure 402 to another structure or to the ambient environment. The fluid may then be circulated through cooling system 400 to extract additional heat. In other embodiments, heated fluid is carried away and replaced by new fluid at the distal side of cooling element 410. As a result, heat-generating structure 402 may be cooled.

Opening and closing of passive vent 412 (passive virtual valve) and active vent 422 (active virtual valve) to draw fluid into chamber 450 and expel fluid through orifices 432 is based upon dynamic changes to flow resistance. In some embodiments, the ratio of active suction flow resistance to active expulsion flow resistance is at least three. In some such embodiments, the ratio of active suction flow resistance to active expulsion flow resistance is not more than ten. In some embodiments, the ratio of passive expulsion flow resistance to passive suction flow resistance is at least three. In some such embodiments, the ratio of passive expulsion flow resistance to passive suction flow resistance is not more than ten. Thus, virtual valves corresponding to vents 410 and/or 420 may be opened and closed. These ratios of pressures may be considered to be due to the change in size of gap 442/442A/442B (e.g. five through thirty micrometers in some embodiments). In some embodiments, the difference in pressure between being open and closed is 0.1 atmosphere through 0.2 atmosphere. For example, the pressure at passive vent 412 in the suction arrangement may be at least 0.1 atmosphere and not more than 0.2 atmosphere less than the pressure at passive vent 412 in the expulsion arrangement. Similarly, the pressure at active vent 422 in the expulsion arrangement may be at least 0.1 atmosphere and not more than 0.2 atmosphere less than the pressure at active vent 422 in the suction arrangement.

Using the cooling system 400, fluid may be drawn in through passive vent 412 (in the suction arrangement) and driven through active vent 422 and orifices 432 (in the expulsion arrangement). Thus, the fluid may efficiently dissipate heat from heat-generating structure 402 in a manner analogous to the fluid driven by cooling system 100. Thus, performance of a device utilizing cooling system 400 may be improved. Further, cooling system 400 may be a MEMS device. Thus, cooling system 400 may small-having a total height not exceeding five hundred micrometers. Consequently, cooling systems 400 may be suitable for use in mobile devices, such as smart phones, other mobile phones, virtual reality headsets, tablets, two-in-one computers, wearables and handheld games, in which limited space is available. Active cooling system 400 may also be used in other compute devices. Because piezoelectric cooling element(s) 410 and/or 420 may be vibrated at ultrasonic frequencies, users may not hear any noise associated with actuation of cooling elements. If driven at or near resonance frequency for the first and second piezoelectric cooling element(s), the power used in operating cooling systems may be significantly reduced.

Figure 5A:
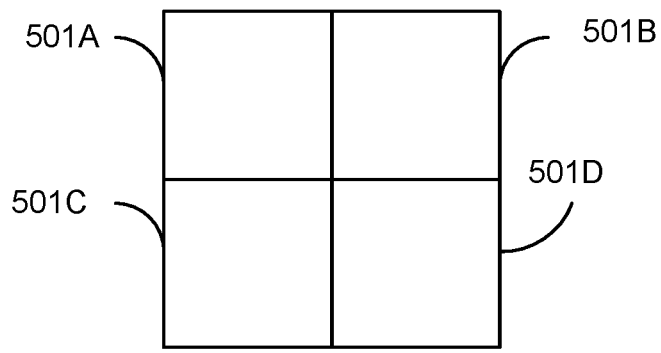
FIGS. 5A-5E depict an embodiment of an active cooling system formed in a tile.
Figure 5B:
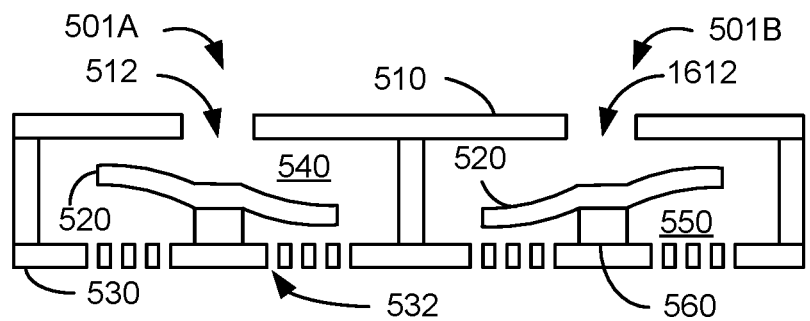
Figure 5C:
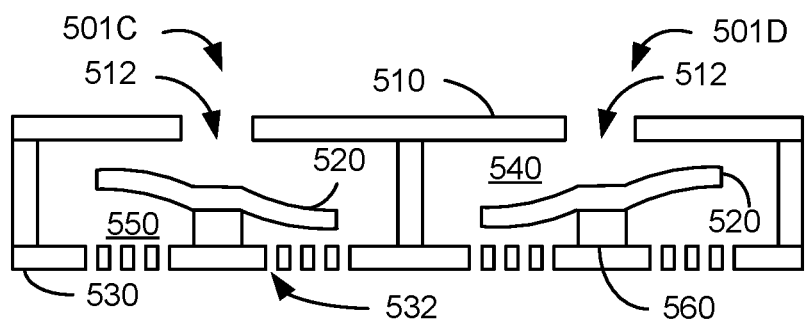
Figure 5D:
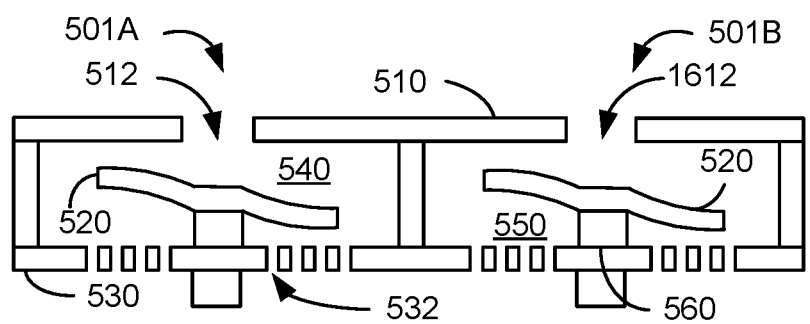
Figure 5E:
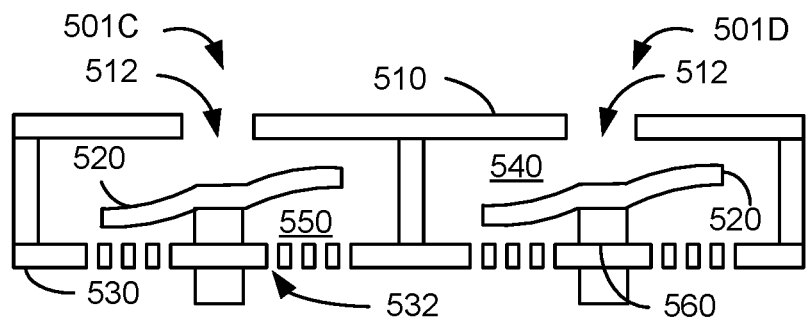

FIGS. 5A-5E depict an embodiment of active cooling system 500 including multiple cooling cells configured as a tile, or array. FIG. 5A depicts a top view, while FIGS. 5B-5E depict side views. FIGS. 5A-5E are not to scale. Cooling system 500 includes four cooling cells 501A, 501B, 501C and 501D (collectively or generically 501), which are analogous to one or more of cooling systems described herein. More specifically, cooling cells 501 are analogous to cooling system 100. In some embodiments, cooling cell(s) 501 may be analogous to cooling system 400 and/or another cooling system. Although four cooling cells 501 in a 2×2 configuration are shown, in some embodiments another number and/or another configuration of cooling cells 501 might be employed. In the embodiment shown, cooling cells 501 include shared top plate 510 having apertures 512, cooling elements 520, shared orifice plate 530 including orifices 532, top chambers 540, bottom chambers 550 and anchors (support structures) 560 that are analogous to top plate 110 having apertures 112, cooling element 120, orifice plate 130 having orifices 132, top chamber 140, bottom chamber 150 and anchor 160. In some embodiments, cooling cells 501 may be fabricated together and separated, for example by cutting through top plate 510 and orifice plate 530. Cooling elements 520 are driven out-of-phase (i.e. in a manner analogous to a seesaw). Further, as can be seen in FIGS. 5B-5C and FIGS. 5D-5E cooling element 520 in one cell is driven out-of-phase with cooling element(s) 520 in adjacent cell(s). In FIGS. 5B-5C, cooling elements 520 in a row are driven out-of-phase. Thus, cooling element 520 in cell 501A is out-of-phase with cooling element 520 in cell 501B. Similarly, cooling element 520 in cell 501C is out-of-phase with cooling element 520 in cell 501D. In FIGS. 5D-5E, cooling elements 520 in a column are driven out-of-phase. Thus, cooling element 520 in cell 501A is out-of-phase with cooling element 520 in cell 501C. Similarly, cooling element 520 in cell 501B is out-of-phase with cooling element 520 in cell 501D. By driving cooling elements 520 out-of-phase, vibrations in cooling system 500 may be reduced.

Cooling cells 501 of cooling system 500 function in an analogous manner to cooling system(s) 100, 400, and/or an analogous cooling system. Consequently, the benefits described herein may be shared by cooling system 500. Because cooling elements in nearby cells are driven out-of-phase, vibrations in cooling system 500 may be reduced. Because multiple cooling cells 501 are used, cooling system 500 may enjoy enhanced cooling capabilities. Further, multiples of individual cooling cells 501 and/or cooling system 500 may be combined in various fashions to obtain the desired footprint of cooling cells.

Figure 6A:
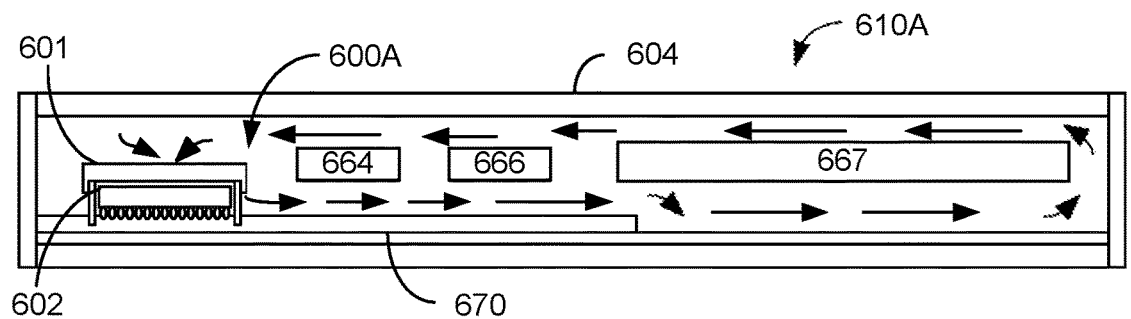
FIGS. 6A-6B depict embodiments of an active cooling system used in devices.
Figure 6B:
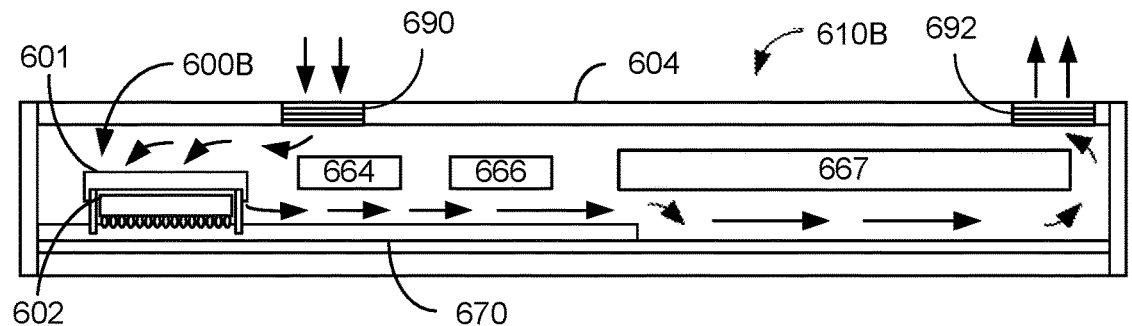

FIGS. 6A and 6B depict cooling systems 600A and 600B used in closed device 610A and open device 610B. Referring to FIG. 6A, active cooling system 600A is used in closed device 610A. Thus, the fluid (e.g. air) remains within the device. Closed device 610A may be a mobile device such as a smartphones, tablet computer, notebook, virtual reality device, and/or other device. Active cooling system 600A includes one or more cooling cell(s) 601, tiles (formed of multiple cooling cells 601), and/or devices that are analogous to cooling cells, cooling systems and their components described herein. However, for clarity, some such structures are not shown.

Cooling cell(s) 601 are analogous to cooling cells 501, cooling systems 100 and/or 400 and their components described herein. Thus, cooling cells 601 may include cooling element(s) driven to undergo vibrational motion for example at the structural and/or acoustic resonant frequency of the chamber(s) therein, an orifice plate and other structures. However, for clarity, some such structures are not shown. Cooling cell(s) 601 also drive fluid at the speeds described herein using the vibrational motion. Further, cooling cells 601 and, in some embodiments, active cooling system 600A and/or 600B have a low profile. For example, the total thickness of cooling cells 601 and/or active cooling systems 600A and/or 600B may not exceed three millimeters. In some embodiments, the total thickness of cooling cell(s) 601 and/or active cooling systems 600A and/or 600B may not exceed than two millimeters.

Heat-generating structure 602 may be an integrated circuit (e.g. a chip package) and/or other structure residing on substrate 670. Heat-generating structure 602 is a source of heat and may be analogous to heat-generating structure 102 and/or 402 or a heat spreader. Although described as a single component, in some embodiments, multiple components may be present in heat-generating structure 602 and cooled by cooling system 600A. For example, heat-generating structure 602 may include a heat spreader, vapor chamber, multiple integrated circuits and/or other mechanism for spreading and/or reducing heat in addition to the component(s) that are the source of heat. Substrate 670 may be a printed circuit board or other structure. Also shown are components 664, 666 and 667 which may be integrated circuits or other components. Mechanisms for mounting components 664, 666 and 667 are not shown. Although not shown, internal and/or external temperature sensors as well as other components including but not limited to a heat spreader might be employed. Cover 604 that encloses device 610A is also shown.

Cooling system 600A is attached in proximity to heat-generating structure 602. For example, cooling system 600A may be attached to a frame in proximity to heat-generating structure 602. In some embodiments, a heat spreader, vapor chamber or other mechanism for spreading and/or reducing heat may be interposed between component 662 and cooling system 600. A jet channel between an orifice plate and component 662, corresponding heat spreader and/or other heat-generating structure may be maintained to allow fluid flow. The flow of fluid in FIG. 6A is depicted by unlabeled arrows.

Cooling system 600A operates in a manner analogous to cooling systems described herein. As can be seen by arrows in FIG. 6A, cooler fluid (e.g. air) near component 667 is drawn toward cooling system 600A. Cooling system 600A drives fluid from its distal to the proximal side Thus, fluid is driven toward and impinges on heat-generating structure 602. Heat from heat-generating structure 602 is transferred to the fluid. The fluid exits the region near heat-generating structure 602 carrying away heat from heat-generating structure 602. The fluid is driven through closed device 610A to a region of device 610A sufficiently distant that heat may be transferred to and dissipated by one or more structures along the path of fluid flow. Stated differently, the fluid follows a path such that the fluid exiting cooling system 600A passes a one or more structures within device 610A that have temperature(s) less than the surface of heat-generating component 602. In some embodiments, these structure(s) have temperature(s) less than the fluid passing the structure(s). Thus, such structure(s) in device 610A may absorb some heat from the fluid carrying heat from heat-generating structure 602. In some embodiments, the fluid is driven to a region distal from cooling system 600A before returning to the cooling system 600A. In some embodiments, the fluid passes a sufficient number and/or configuration of lower temperature structure(s) that at least ninety percent of the heat transferred from heat-generating structure 602 is removed from the fluid. In some embodiments, the fluid passes a sufficient number and/or configuration of lower temperature structure(s) that at least eighty percent of the heat transferred from heat-generating structure 602 is removed from the fluid. In some embodiments, the fluid passes a sufficient number and/or configuration of lower temperature structure(s) that at least fifty percent of the heat transferred from heat-generating structure 602 is removed from the fluid at steady state operation of heat-generating structure 602. Other fractions of the heat transferred from heat-generating structure 602 are removed from the fluid in some embodiments. In some embodiments, device 610A includes ducting, grooves in substrate 670 and/or case 604 or other features used direct the fluid flow. In some embodiments, the fluid's path may include a heat sink or other mechanism for dissipating heat. For example, cover 604 may be used to dissipate heat.

For example, in device 610A, fluid exiting the region of heat-generating structure 602 is driven past components 664 and 666 and along a portion of substrate 670. Fluid is also shown as traveling along cover 604 and around component 667 before returning along components 666 and 664. The fluid may then re-enter cooling cell 601 and be reused. Although not explicitly shown in FIG. 6A some fluid may flow between components 664 and 666 and between components 666 and 666. Further, in some embodiments, fluid need not flow to the opposing end (e.g. past component 667) to be cooled as desired. Because cover 604 and/or one or more of components 664, 666 and 667 are cooler than heat-generating structure 602 and cooler than the fluid carrying heat from heat-generating structure 602, heat in the fluid can be absorbed by one or more of component(s) 604, 664, 666, and 667. In some embodiments, the fraction of heat transferred to one or more of component(s) 604, 664, 666, and 667 is as described above. Thus, the fluid returning to cooling cell 601 is cooler than the fluid leaving the region of heat-generating structure 602. Cooling cell 601 drives the cooler fluid toward heat-generating structure 602. Because the fluid has been cooled while traversing device 610A, the fluid can absorb heat from heat-generating structure 602.

Active cooling system 600A may provide the benefits of cooling system(s) 100, 400, and/or 500. Thus, cooling system 600A may more efficiently and quietly cool heat-generating structure 602 at lower power. Thus, performance of heat-generating structure 602 may be improved. Additional cooling systems (not shown) can be employed and/or cooling system 600A can be increased in size, for example by adding more cells, to cool additional portions of the device, such as components 664 and/or 667. Because active cooling system 600A circulates heated fluid within closed device 610A, heat from heat-generating structure 602 may be spread among various structures that may be better able to dissipate heat. Thus, performance of closed device 610A may be improved.

In addition, active cooling system 600A may also be used to mitigate issues related to hot spots on cover 604 of device 610A. In conventional devices which do not use active cooling system 600A, hotspots typically develop in the back portion of the cover, just above the integrated circuit or heat spreader (corresponding to the portion of cover 604 just above heat-generating structure 602) due to radiation and/or free convection. To reduce the temperatures at these hotspots, conventional devices typically increase the distance between the heat spreader and back cover (e.g. increase the distance between heat-generating structure 602 and cover 604), place holes above the heat spreader/integrated chip area (e.g. place holes in cover 604 above heat-generating structure 602) and try to use a fan system to pull air through these holes, or place conductive tape on the back cover near the heat spreader/integrated circuit (e.g. place conductive tape in the region of cover 604 near heat-generating structure 602) to conduct heat away from the hot spot to conduct the heat away from the hot spot. However, there may be limited ability to increase the distance between the back cover and the heat spreader/integrated circuit in a conventional system. Typically there is a high flow resistance in the region of the heat spreader/integrated circuit. Thus, a fan may have limited ability to generate a sufficient flow in this region to mitigate hot spots. Further, fans may be unable to be used in devices such as smartphones. Similarly, the use of conductive tape provides only a limited ability to spread heat across the cover. In contrast, when active cooling system 600A is turned on, cooler fluid (e.g. air) flowing toward active cooling system 600A can not only be used to cool heat-generating structure 602, but also naturally cools the region of cover 604 near active cooling system 600A. For example, in some embodiments, the region near the inlet of active cooling system 600A may be at least twenty degrees Celsius cooler than in fluid exiting the region near heat-generating structure 602 for steady state operation of device 610. In some embodiments, the region near the inlet of active cooling system 600A may be at least thirty degrees Celsius cooler than in fluid exiting the region near heat-generating structure 602 for steady state operation of device 610. In some embodiments, the region near the inlet of active cooling system 600A may be up to thirty-five degrees Celsius cooler than in fluid exiting the region near heat-generating structure 602 for steady state operation of device 610. For similar reasons, when system 600A is on and used to cool beat-generating structure 602, the external surface temperature of case 604 proximate to (e.g. directly aligned with) the inlet (e.g. vents analogous to vents 112 and/or 422) of active cooling system 600A is decreased by at least five degrees Celsius. In some embodiments, the external surface temperature of case 604 proximate to the inlet of active cooling system 600A is decreased by at least ten degrees Celsius when system 600A is on and used to cool heat-generating structure 602. Other (e.g. larger) decreases are possible in some embodiments. Thus, hot spots area on cover 604 may be reduced or eliminated.

FIG. 6B depicts cooling system 600B used in open device 610B. Thus, the fluid (e.g. air) enters, travels through and exits the device. Cooling system 600B and open device 610B are analogous to cooling system 600A and closed device 610A, respectively. Open device 610B may be a mobile device such as a smartphone, tablet computer, notebook, virtual reality device, and/or other computing device. Active cooling system 600B includes one or more cooling cell(s) 601, that are analogous to cooling cells 501 and 601, cooling systems 100 and/or 400 and their components described herein. Thus, cooling cells 601 may include cooling element(s) driven to undergo vibrational motion for example at the structural and/or acoustic resonant frequency, an orifice plate and other structures. However, for clarity, some such structures are not shown.

Device 610B is analogous to device 610A. Consequently, analogous structures have similar labels. Device 610B includes heat-generating structure 602 on substrate 670, cover 604, and additional components 664, 666 and 667 that are analogous to heat-generating structure 602, substrate 670, cover 604, and additional components 664, 666, and 667, respectively of device 610A. Mechanisms for mounting components 664, 666 and 667 are not shown. Although not shown, internal and/or external temperature sensors as well as other components might be employed. Cooling system 600B is attached in proximity to heat-generating structure 602. For example, cooling system 600B may be attached to a frame in proximity to heat-generating structure 602. A jet channel between an orifice plate and heat-generating structure 602, corresponding heat spreader and/or other heat-generating structure may be maintained to allow fluid flow. The flow of fluid in FIG. 6B is depicted by unlabeled arrows. Vents 690 and 692 allow for fluid communication between the interior of device 610B and the external environment. In the embodiment shown, vent 690 operates as inlet 690 and vent 692 operates as outlet 692.

Cooling cell(s) 601 of cooling system 600B operate in a manner analogous to cooling systems described herein. As can be seen by arrows in FIG. 6B, cooler fluid (e.g. air) near cooling system 600B is drawn toward cooling cell(s) 601. In particular, fluid from inlet 690 travels toward cooling cell(s) 601. Cooling cell(s) 601 drive fluid from the side distal side from heat-generating structure 602 to the side proximal to heat-generating structure 602. Thus, fluid is driven toward and contacts heat-generating structure 602. Heat is transferred to the fluid. The fluid flows along heat-generating structure 602 and exits the region near heat-generating structure 602, carrying away heat from heat-generating structure 602. Thus, fluid carrying heat from heat-generating structure 602 can be expelled from device 610B and new fluid from the outside environment drawn in through inlet 690 to cool heat-generating structure 602. Further, because the fluid is directed to outlet 692 that is distal from cooling cell(s) 601, heat may be transferred to and dissipated by one or more structures along the path in a manner analogous to that described above for cooling system 600A. For example, heat may be transferred to cover 604 and/or component(s) 664, 666 and 667 because structures 604, 664, 666, and 667 may have a lower temperature than heat-generating structure 602 and/or a lower temperature than the fluid carrying heat from heat-generating structure 602. Thus, the fluid may be cooled at least somewhat (i.e. may transfer heat to one or more structures 604, 664, 666 and/or 667) before exiting device 610B.

In some embodiments, the fluid passes a sufficient number or configuration of lower temperature structure(s) and/or a sufficient distance that at least ninety percent of the heat transferred from heat-generating structure 602 is removed from the fluid. In some embodiments, the fluid passes a sufficient number and/or configuration of lower temperature structure(s) and/or a sufficient distance that at least eighty percent of the heat transferred from heat-generating structure 602 is removed from the fluid. In some embodiments, the fluid passes a sufficient number and/or configuration of lower temperature structure(s) and/or a sufficient distance that at least fifty percent of the heat transferred from heat-generating structure 602 is removed from the fluid at steady state operation of heat-generating structure 602. Other amounts of heat may be dissipated in other embodiments. In some embodiments, device 610B includes ducting, grooves in substrate 670 and/or case 604 or other features used direct the fluid flow. In some embodiments, the fluid's path may include a heat sink or other mechanism for dissipating heat. For example, cover 604 may be used to dissipate heat. Consequently, heat may be efficiently removed from device 610B.

Active cooling system 600B may share benefits of active cooling systems 100, 400, 500, and/or 600A. Further, because cool fluid form outside of device 610B can be used to cool heat-generating structure 602, heat management may be improved. Thus, performance of heat-generating structure 602 may be further improved. Additional cooling systems (not shown) can be employed and/or cooling system 600B can be increased in size, for example by adding more cells, to cool additional portions of the device, such as components 664 and/or 667. Further, fluid may be driven to an outlet 692 that is sufficiently distant that fluid is at least somewhat cooled prior to exiting device 610B. Thus, outlets 692, and other structures in device 610B, may be placed where desired. Consequently, configuration of device 610B may be more flexible. Because the fluid exiting device 610B may be cooler than if vent 692 were placed close to heat-generating structure 602, discomfort or injury to the user due to fluid flowing through outlet 692 may be mitigated or avoided. Further, hot spots on cover 604 may be reduced in temperature or eliminated.

Figure 7A:
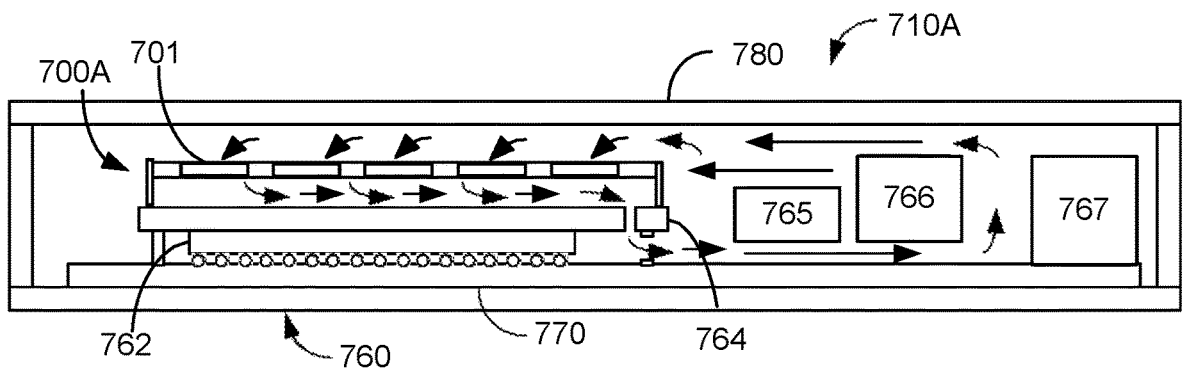
FIGS. 7A-7B depict embodiments of an active cooling system used in devices.
Figure 7B:
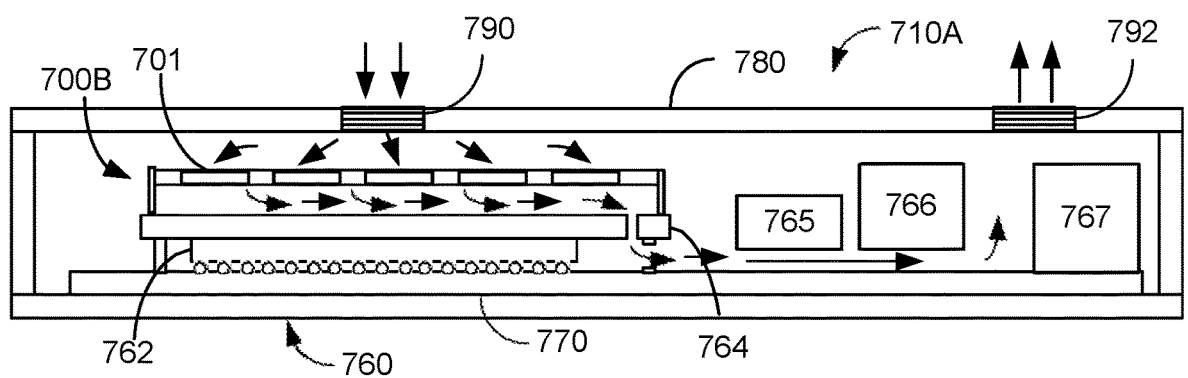

Similarly, FIGS. 7A-7B depict active cooling systems 700A and 700B used in closed device 710A and open device 710B, respectively. Cooling systems 700A and 700B each includes one or more cooling cell(s), tiles, and/or devices that are analogous to cooling cells, cooling systems and their components described herein. For example, cooling systems 700A and 700B are analogous to one or more of active cooling systems 100, 400, 500, 600A and/or 600B. However, for clarity, some such structures are not shown. In particular, cooling system 700A including cooling cells 701, and closed device 710A are analogous to active cooling system 600A, cooling cell(s) 601 and device 610A. Active cooling system 700B, cooling cells 701 and open device 710B are analogous to cooling system 600A, cooling cell(s) 601, and open device 610B. Active cooling systems 700A and 700B each explicitly include multiple cooling cells 701, of which only one is labeled in each drawing.

Heat generating structure 760 includes component 762 (e.g. a chip package) residing on substrate 770 and heat spreader 764. Although described as a single component, in some embodiments, multiple components may be present in component 762. Heat spreader 764 spreads heat from component 762 and is cooled by cooling system 700A. Thus, in device 710A, heat spreader 764 is explicitly interposed between the fluid driven by cooling system 700A and the component 762 that generates heat. Substrate 770 may be a printed circuit board. Heat spreader 764 resides between cooling system 700A and component 762. Also shown are components 765, 766 and 767 which may be integrated circuits or other components. Mechanisms for mounting components 765, 766 and 767 are not shown. Cover 780 that encloses device 710A is also shown. Cooling system 700A is attached in proximity to component 762. For example, cooling system 700A may be attached to a frame in proximity to component 762. A jet channel between an orifice plate and heat spreader 764 is thus present. The flow of fluid in FIG. 7A is depicted by unlabeled arrows.

Cooling system 700A operates in a manner analogous to cooling systems described herein, particularly system 600A. As can be seen by arrows in FIG. 7A, cooler fluid (e.g. air) from between components 766 and 767 is drawn toward cooling system 700A. Cooling system 700A drives fluid from its distal to the proximal side and along heat spreader 764. Thus, heat is transferred from heat spreader 764 to the fluid and carried along heat spreader 764. Further, heat spreader 764 includes an aperture therein. The heated fluid exits the region near the edge of heat spreader 764, carrying away heat from component 762 and heat spreader 764. Device 710A is configured such that the fluid travels through device 710A to a region of device 710A sufficiently distant that heat may be transferred to and dissipated by one or more structures along the path of fluid flow. Stated differently, the fluid follows a path such that the fluid exiting the region near heat spreader 764 passes one or more structures that have temperature(s) less than the surface of heat spreader 764. In some embodiments, these structure(s) have temperature(s) less than the fluid passing the structure(s). Thus, such structure(s) in device 710A may absorb some heat from the fluid carrying heat from heat spreader 764. In some embodiments, the fluid is driven to a region of system 710A distal from cooling system 700A before returning to the cooling system 700A. In some embodiments, the fluid passes a sufficient number and/or configuration of lower temperature structure(s) that at least ninety percent of the heat transferred from component 762 is removed from the fluid. In some embodiments, the fluid passes a sufficient number and/or configuration of lower temperature structure(s) that at least eighty percent of the heat transferred from component 762 is removed from the fluid. In some embodiments, the fluid passes a sufficient number and/or configuration of lower temperature structure(s) that at least fifty percent of the heat transferred from component 762 is removed from the fluid at steady state operation of component 762. Other fractions of the heat transferred from heat-generating structure 760 are removed from the fluid in some embodiments. In some embodiments, device 710A includes ducting, grooves in substrate 770 and/or case 780 or other features used direct the fluid flow. In some embodiments, the fluid's path may include a heat sink or other mechanism for dissipating heat. For example, cover 780 and/or other structures may be used to dissipate heat.

Active cooling system 700A may provide the benefits of cooling system(s) 100, 400, 500, 600A and/or 600B. Thus, cooling system 700A may more efficiently and quietly cool heat-generating structure 760 at lower power. Thus, performance of component 762 may be improved. Additional cooling systems (not shown) can be employed and/or cooling system 700A can be increased in size, for example by adding more cells, to cool additional portions of the device, such as components 765, 766 and/or 767. Because active cooling system 700A circulates heated fluid within closed device 710A, heat from heat-generating structure 660 may be spread among various structures that may be better able to dissipate heat. Thus, performance of closed device 710A may be improved. Further, hot spots on case 780 may be reduced in temperature or eliminated.

FIG. 7B depicts cooling system 700B used in open device 710B. Thus, the fluid (e.g. air) enters, travels through and exits the device. Cooling system 700B and open device 710B are analogous to cooling system 700A and closed device 710A, respectively. Open device 710B may be a mobile device such as a smartphone, tablet computer, notebook, virtual reality device, and/or other computing device. Active cooling system 700B includes multiple cooling cell 701, that are analogous to cooling cells 501, 601 and 701, cooling systems 100 and/or 400 and their components described herein. Thus, cooling cells 701 may include cooling element(s) driven to undergo vibrational motion for example at the structural and/or acoustic resonant frequency, an orifice plate and other structures. However, for clarity, some such structures are not shown.

Device 710B is analogous to device 710A. Consequently, analogous structures have similar labels. Device 710B includes heat-generating structure 660 on substrate 670 that explicitly includes heat spreader 764 separate from component 762. Also shown are additional components 765, 766 and 767 as well as cover 780, which are analogous to those shown in FIG. 7A. Although not shown, internal and/or external temperature sensors as well as other components might be employed. Cooling system 700B is attached in proximity to heat-generating structure 760. For example, cooling system 700B may be attached to a frame in proximity to heat-generating structure 760. A jet channel between an orifice plate and heat spreader 764 may be maintained to allow fluid flow. The flow of fluid in FIG. 6B is depicted by unlabeled arrows. Vents 790 and 792 allow for fluid communication between the interior of device 610B and the external environment. In the embodiment shown, vent 790 operates as inlet 790 and vent 792 operates as outlet 792.

Cooling cells 701 of cooling system 700B operate in a manner analogous to cooling systems described herein. As can be seen by arrows in FIG. 7B, cooler fluid (e.g. air) from inlet 790 is drawn toward cooling cells 701. Cooling cells 701 drive fluid from the side distal side from heat spreader 764 to the side proximal to heat spreader 764. Thus, fluid is driven toward and along the surface of heat spreader 764. Heat is transferred to the fluid. The fluid exits the region near heat spreader 764, carrying away heat. Because of the configuration of device 710B, the fluid is directed toward outlet 792. Thus, fluid carrying heat from heat-generating structure 760 can be expelled from device 710B and new fluid from the outside environment drawn in through inlet 790 to cool heat-generating structure 760. Because the fluid is directed to outlet 792 that is distal from cooling cells 701, heat may be transferred to and dissipated by one or more structures along the path in a manner analogous to that described above for cooling system 700A. For example, heat may be transferred to cover 704 and/or component(s) 765, 766 and 767 because structures 704, 765, 766, and 767 may have a lower temperature than heat spreader 764 and/or a lower temperature than the fluid carrying heat from heat-generating structure 760. Thus, the fluid may be cooled at least somewhat (i.e. may transfer heat to one or more structures 704, 765, 766 and/or 767) before exiting device 710B. In some embodiments, the fluid passes a sufficient number or configuration of lower temperature structure(s) and/or a sufficient distance that the fractions of heat transferred from heat-generating structure 760 described herein are removed from the fluid. Consequently, heat may be efficiently removed from device 710B.

Active cooling system 700B may share benefits of active cooling systems 100, 400, 500, 600A, 600B, and/or 700A. Further, because cool fluid form outside of device 710B can be used to cool heat-generating structure 760, heat management may be improved. Thus, performance of heat-generating structure 760 may be further improved. Additional cooling systems (not shown) can be employed and/or cooling system 700B can be increased in size, for example by adding more cells, to cool additional portions of the device, such as components 765 and/or 767. Further, fluid may be driven out an outlet 792 that is sufficiently distant that fluid is at least somewhat cooled prior to exiting device 710B. Thus, outlets 792, and other structures in device 610B, may be placed where desired. Consequently, configuration of device 710B may be more flexible. Because the fluid exiting device 710B may be cooler than if vent 792 were placed close to heat-generating structure 760, discomfort or injury to the user due to fluid flowing through outlet 792 may be mitigated or avoided. Further, hot spots on case 780 may be reduced in temperature or eliminated.

Figure 8:
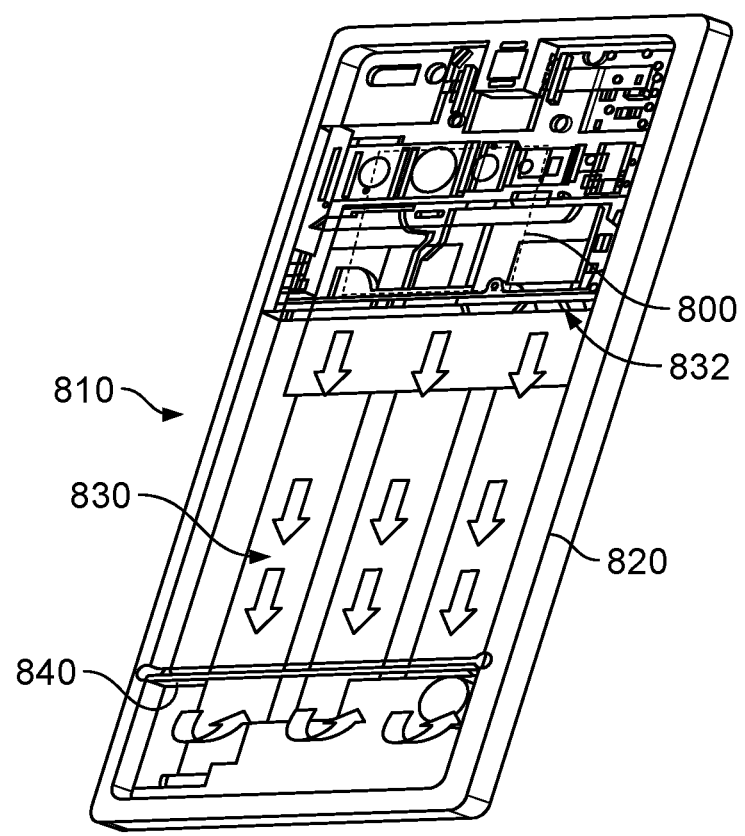
FIG. 8 depicts an embodiment of an active cooling system as used in a smart phone.

FIG. 8 depicts cooling system 800 used in smartphone 810. Cooling system 800 includes one or more cooling cell(s), tiles, and/or devices that are analogous to cooling cells, cooling systems and their components described herein. However, for clarity, such structures are not shown. In the embodiment shown, smartphone 810 is closed. Thus, the fluid (i.e. air) used to cool heat-generating structures in smartphone 810 remains within smartphone 810. Smartphone also includes housing 820 and midframe 840. In other embodiments, smartphone 810 might include inlet and/outlet vents in order to allow for fluid communicating with the external environment. In some embodiments, multiple active cooling systems 800 might be deployed in smartphone 810. For clarity, a portion of the top of smartphone 810 has been removed.

In operation, active cooling system 800 drives fluid toward the underlying heat-generating structure(s), such as processor(s). As can be seen by the direction of the unlabeled arrows in FIG. 8, heated fluid travels along smartphone 810, past the battery. As the heated fluid traverses smartphone 810, heat is transferred to other structure(s) having a lower temperature. For example, heat may be transferred to housing 820 and/or midframe 840. Smartphone 810 is configured to allow for this fluid flow. For example, grooves or channels 820 (of which only one is labeled) may be provided in midframe 840 and/or housing 820 to direct the flow of fluid. Similarly, spaces 832 provide a path for fluid to exit the region near active cooling system 800. Thus, a path for the flow of fluid through one or more heat-absorbing structures in device 810 is provided. At a region of smartphone 810 distal from cooling system 800 (the opposing end of smartphone 810 in the embodiment shown), cooled fluid begins its return path to cooling system 800. Thus, the fluid circulates within smartphone 810.

Thus, cooling system 800 may be used to cool smartphone 810. This cooling may be more efficient and capable of transferring a greater amount of heat from heat-generating structures. Further, because cooling system 800 is thin, cooling system 800 may be integrated into smartphone 800 with little or no change in thickness. Performance of smartphone 800 may thus be improved. Further, hot spots on housing 820 may be reduced in temperature or eliminated.

Figure 9A:
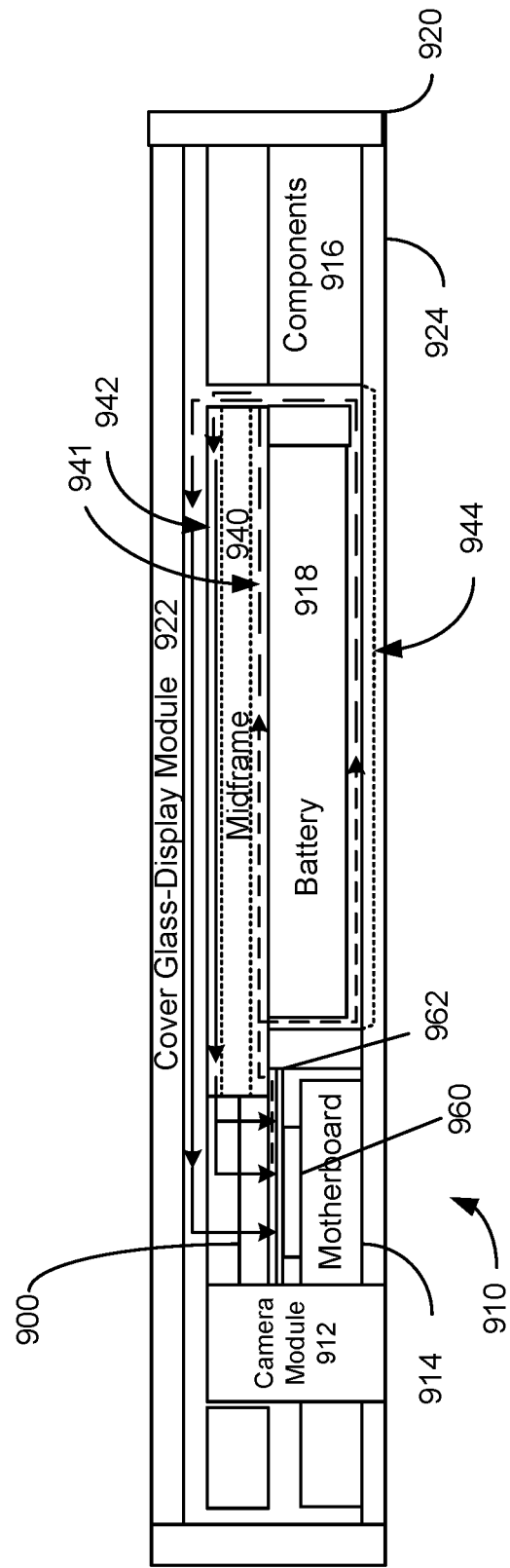
FIG. 9A-9B depicts an embodiment of an active cooling system as used in a closed smartphone.
Figure 9B:
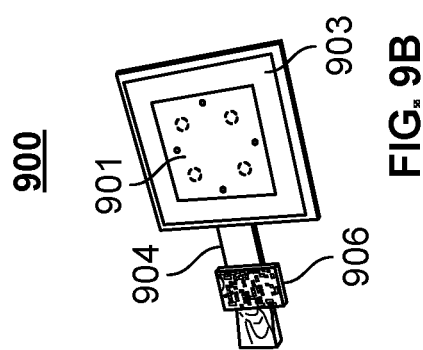

FIGS. 9A-9B depict smartphone 910 utilizing cooling system 900 and cooling system 900. Cooling system 900 includes four cooling cells 901 that are analogous to cooling cells/cooling systems described herein. Also shown is optional ducting 903 used to control fluid flow around cooling cells 901, flexible connector 904 and associated electronics 906. In the embodiment shown, smartphone 910 is closed. Thus, the fluid (i.e. air) used to cool heat-generating structures in smartphone 910 remains within smartphone 910. Smartphone 910 includes housing 920 having cover glass 922 and back cover 924. Smartphone 910 also includes camera module 912, motherboard 914, processor 960 and heat spreader 962 which form a heat-generating structure, other electronic components 916, battery 918, and midframe 940.

As can be seen in FIG. 9A, cooling system 900 drives cooled fluid (solid unlabeled arrows) onto a heat-generating structure. In this embodiment, the heat-generating structure includes heat spreader 962 thermally coupled to processor 960 on motherboard 914. Cooling system 900 is coupled to midframe 940 in this embodiment. In some embodiments, cooling system 900 may be connected to a different component. Fluid driven by cooling system 900 is driven toward processor 960 and heat spreader 962, contacts and flows along heat spreader 962, and extracts heat generated by processor 960. The heated fluid (dashed unlabeled arrows) travels along midframe 940 and battery 918. Back cover 924 may be used to dissipate heat. For example, heat in the fluid may be convected to back cover 924 and radiated out. Similarly, heat may also be transferred to midframe 940 and dissipated. Heat may be transferred to back cover 924 and midframe 940 because these structures are lower in temperature than the heated fluid. Grooves 941 (shown with dotted lines) in midframe 940 in the side of midframe 940 proximal to battery 918 and grooves 944 (shown with dotted lines) in back cover 924 may be used to control the flow of the fluid. In some embodiments, the grooves may be on the order of 0.2 millimeters through 0.4 millimeters (e.g. nominally 0.3 millimeters) deep. Thus, as the fluid flows along midframe 940 and back cover 924, the fluid cools. This is indicated by unlabeled longer dashed arrows. Past battery 918, the cooler fluid returns along cover glass 922, where it continues to cool. Fluid may be directed in a space between midframe 940 and cover glass 922 and/or in grooves 942 (shown with dotted lines) in midframe 940. In some embodiments, the space and/or grooves 942 may be on the order of 0.2 millimeters through 0.4 millimeters (e.g. nominally 0.3 millimeters) deep. The cooled fluid returns to cooling system 900, where it can again be used to cool the processor and/or other components.

Thus, cooling system 900 may be used to cool smartphone 900. The configuration of smartphone 900, such as grooves and the placement of structures therein, may also aid in directing fluid flow and absorbing heat from the fluid. This cooling may be more efficient and capable of transferring a greater amount of heat from heat-generating structures. Further, because cooling system 900 is thin, cooling system 900 may be integrated into smartphone 900 with little or no change in thickness. Performance of smartphone 900 may thus be improved. Further, hot spots on cover 922 may be reduced in temperature or eliminated.

Figure 10A:
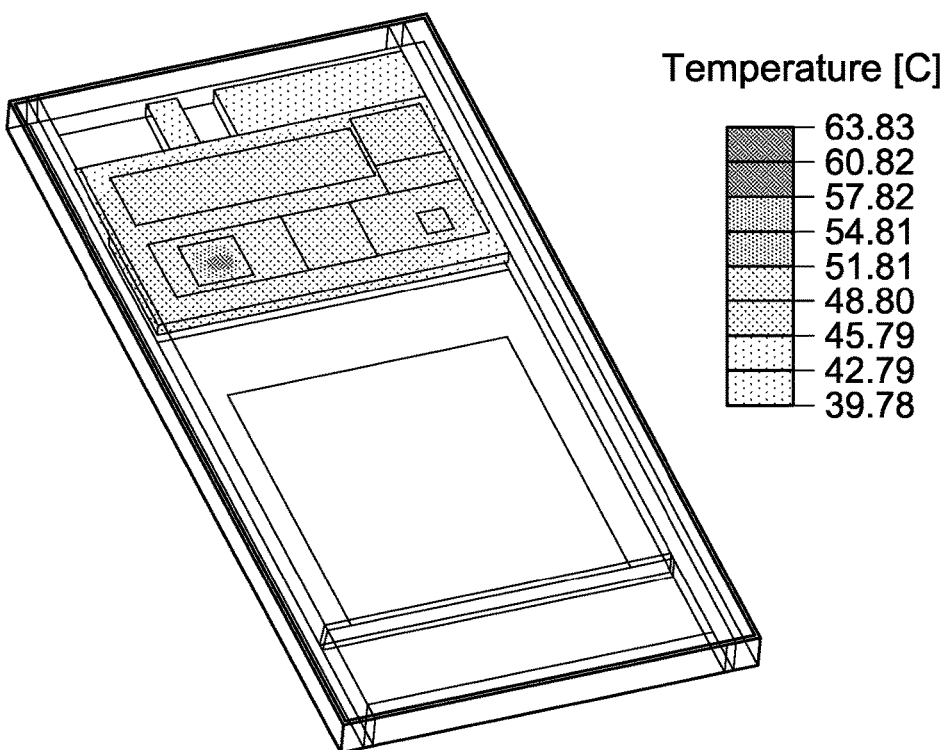
FIGS. 10A-10D depict embodiments of and performance for smartphones with and without cooling systems.
Figure 10B:
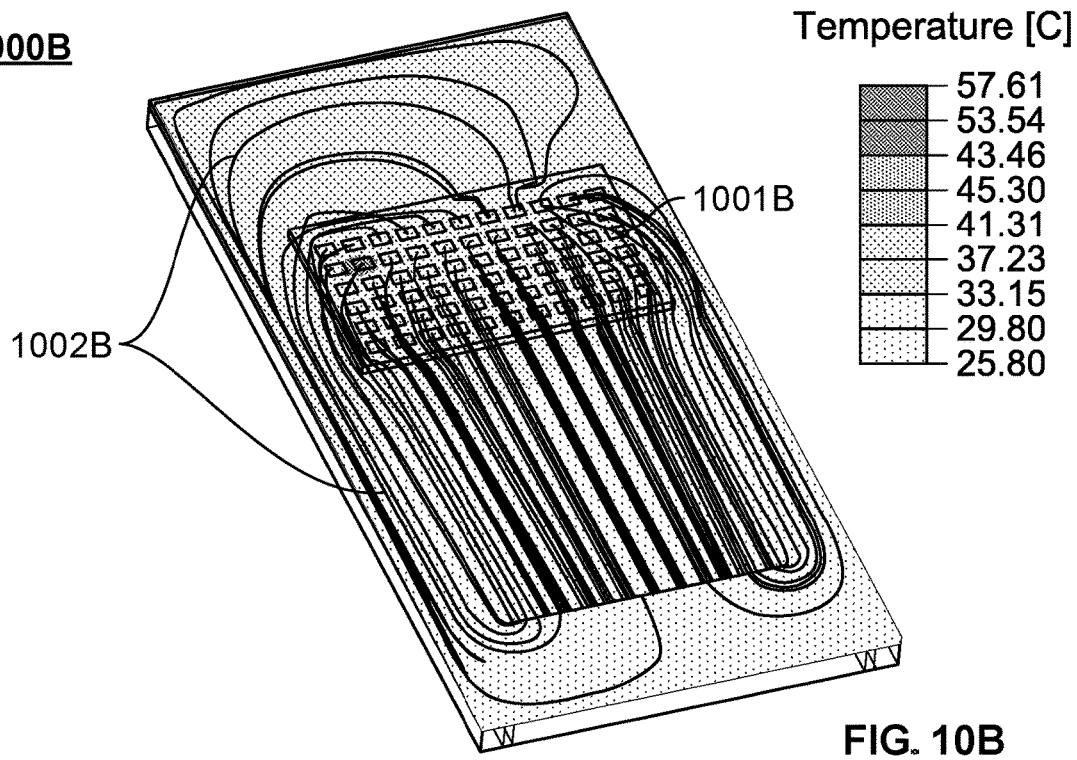

FIGS. 10A-10D depict embodiments of and performance for smartphones with and without cooling systems such as are described herein. More specifically, FIG. 10A depicts smartphone 1000A cooled using only a vapor chamber. Consequently, no active cooling system is used. Thus, fluid flow is minimal within smartphone 1000A. FIG. 10B depicts an embodiment of closed smartphone 1000B including active cooling system 1001B as described herein. Thus, fluid (e.g. air) used in cooling the smartphone depicted in FIG. 10B remains within the smartphone. Smartphone 1000B is configured such that fluid follows a path from the surface of the heat-generating structure(s) near cooling system 1001B past structure(s) having lower temperature(s) than the surface of the heat-generating structure. The structure(s) absorb heat from the fluid. The fluid then returns to cooling system 1001B. The path of the fluid may be seen by lines 1002B of which only two are labeled.

Figure 10C:
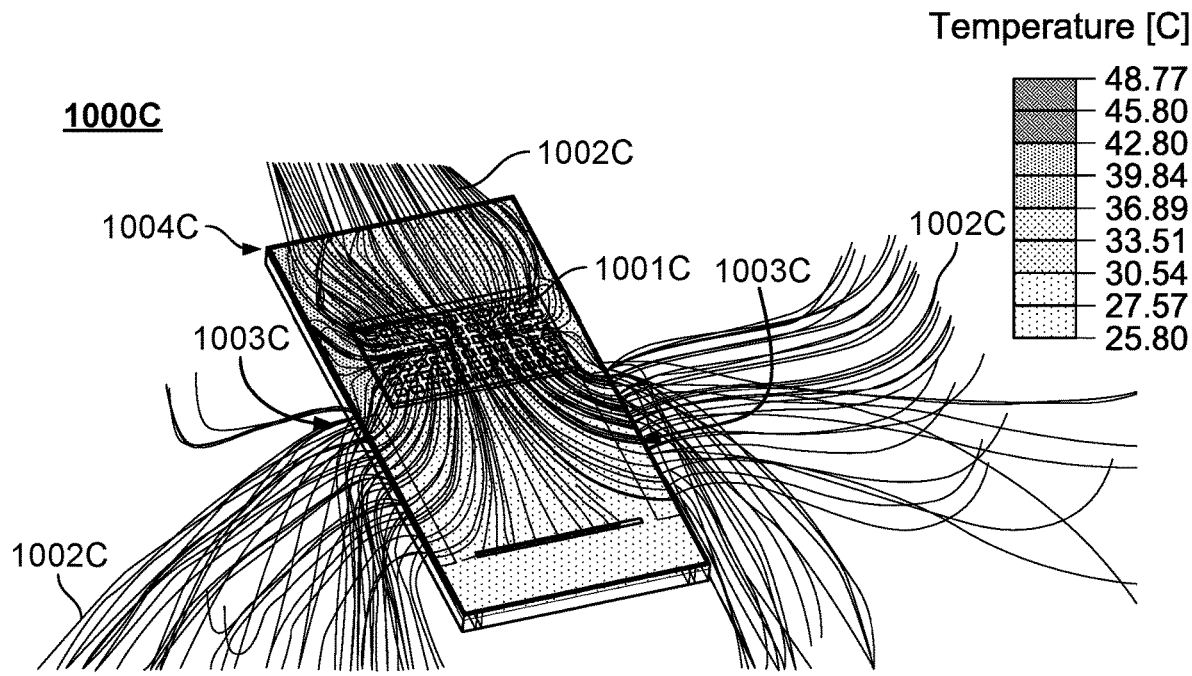

FIG. 10C depicts an embodiment of vented smartphone 1000C including cooling system 1001C as described herein. Vented smartphone 1000C also includes inlets 1003C and outlet 1004C. Thus, for smartphone 1000C depicted in FIG. 10C, cooled air from outside of smartphone 1000C may be used by the cooling system for cooling heat-generating structures and heated fluid vented from the smartphone. Smartphone 1000C is configured such that cooler fluid enters via inlets 1003C and is driven toward a heat-generating structure by active cooling system 1001C, as described previously. The fluid extracts heat from the heat-generating structure and follows a path from the surface of the heat-generating structure(s) near cooling system 1001C past structure(s) having lower temperature(s) than the surface of the heat-generating structure. The structure(s) absorb heat from the fluid. The fluid is directed out of vented smartphone 1000C via outlet 1004C. The path of the fluid may be seen by lines 1002C of which only three are labeled.

Figure 10D:
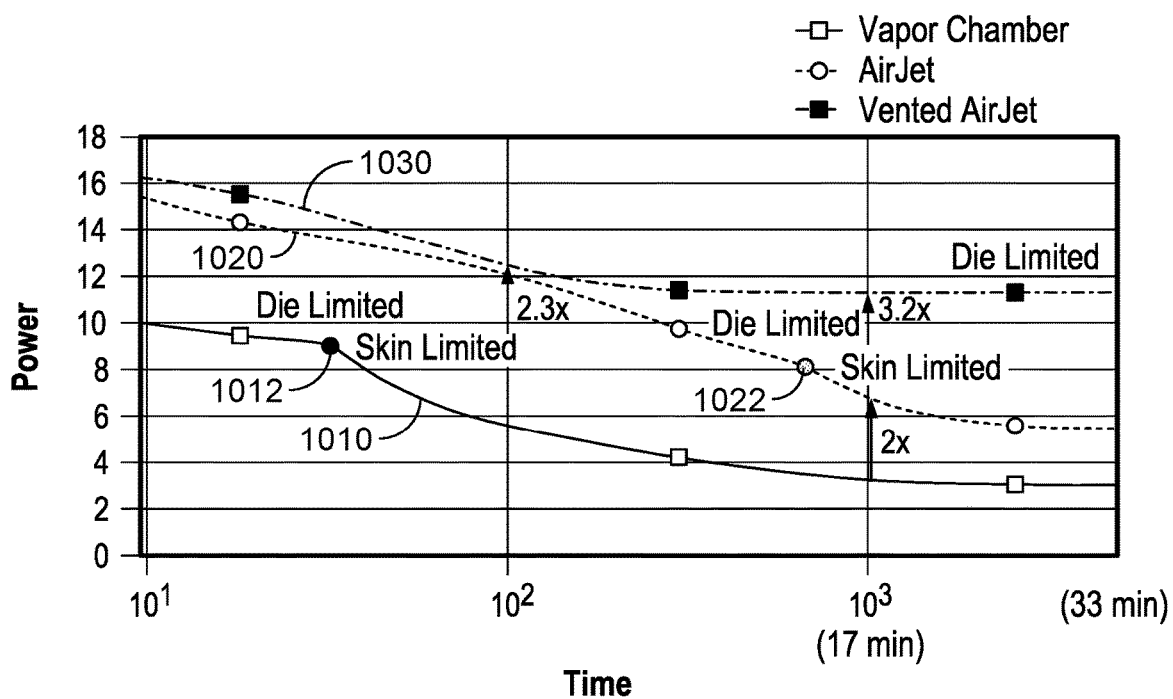

FIG. 10D is a graph including curves 1010, 1020 and 1030 indicating the power usable by the processors in the smartphones 1000A, 1000B and 1000C, respectively, of FIGS. 10A, 10B and 10C, respectively. FIG. 10D is for explanatory purposes only and is not intended to correspond to particular devices. As can be seen in FIG. 10D, curve 1010 for smartphone 1000A (no active cooling system described herein) utilizes lower power because of heating of the processor. Further, the processor commences throttling at point 1012 sooner and at a lower power. Curve 1020 indicates that the processor for closed smartphone 1000B using cooling system 1001B described herein can utilize (and dissipate) higher power. Further, the throttling at point 1022 occurs later and at a higher power than for curve 1010. Curve 1030 indicates that a processor for vented smartphone 1000C using a cooling system described herein may utilize even higher power and may resist throttling for longer. Thus, performance may be improved. Further, as described above, because of the size of the cooling system, the thickness of a smartphone utilizing the cooling system may remain unchanged. In addition, hot spots on the covers of smartphones 1000B and 1000C may be reduced in temperature or eliminated.

Figure 11A:
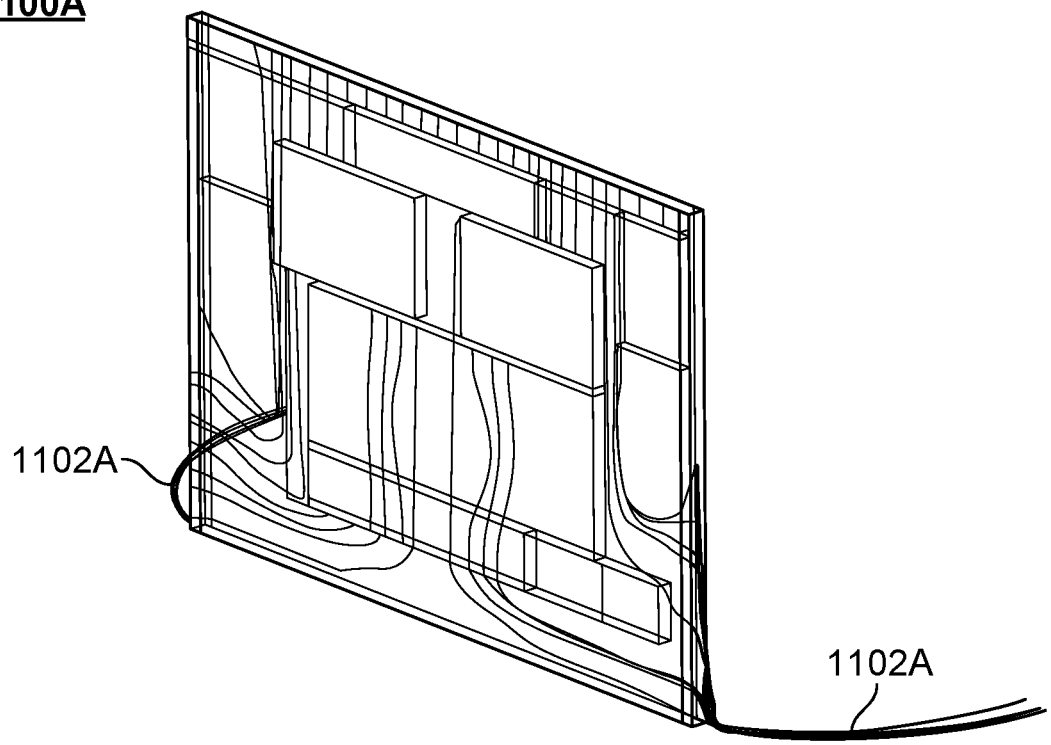
FIGS. 11A-11C depict performance for embodiments of notebooks with and without cooling systems.
Figure 11B:
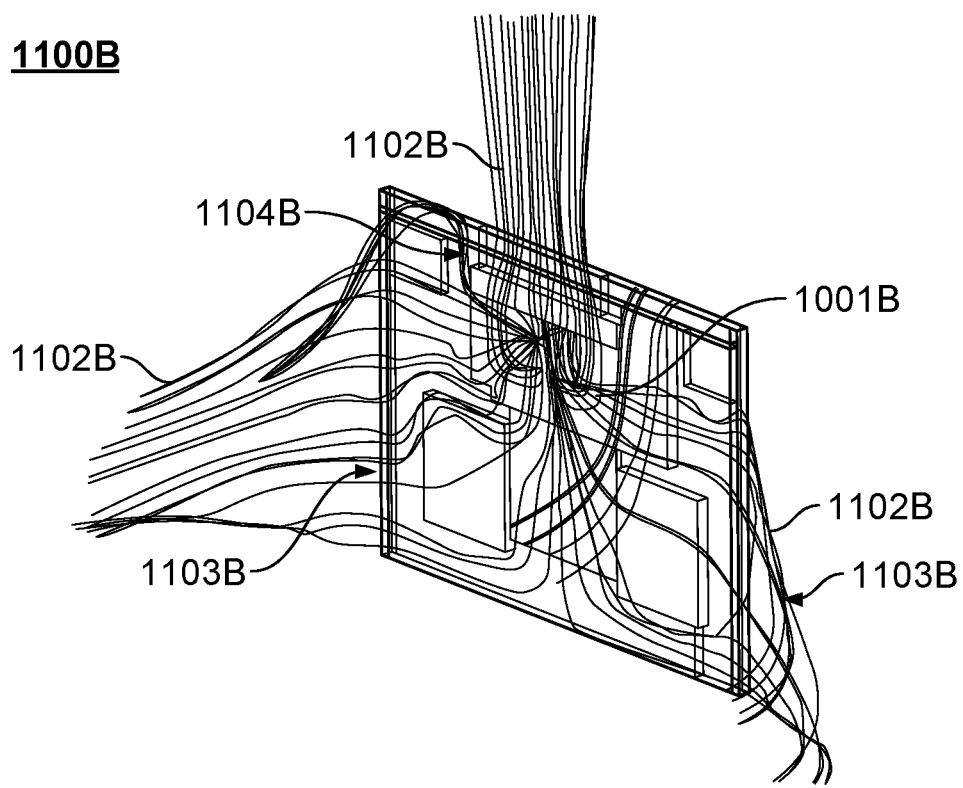
Figure 11C:
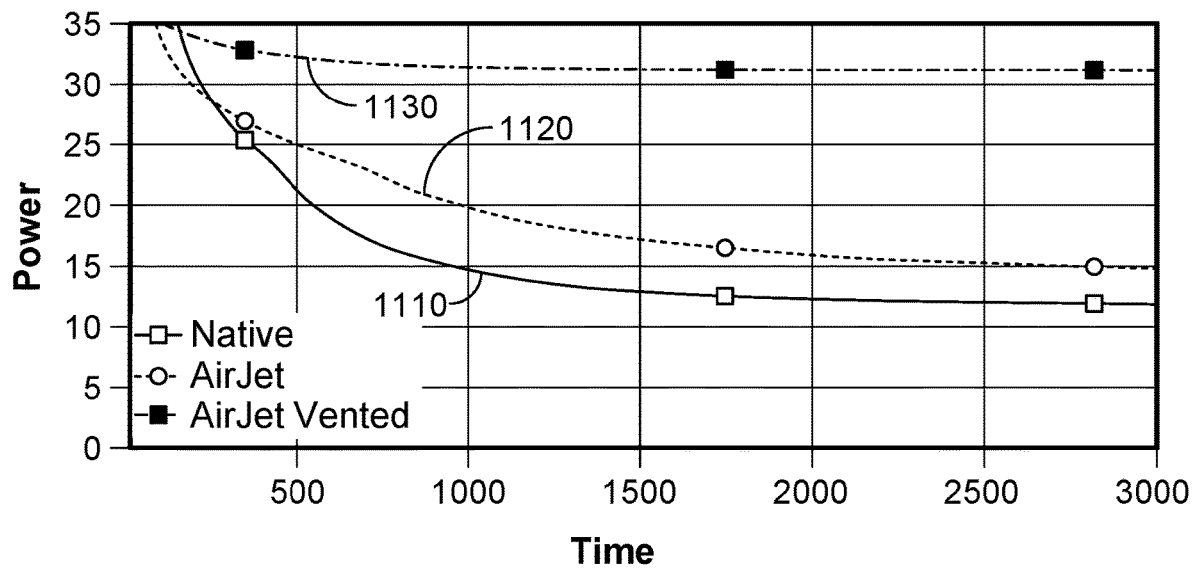

The cooling systems described herein may be used with other devices and achieve analogous performance improvements. For example, FIGS. 11A-11C compares performance for notebook computer 1100A without active cooling as described herein (shown in FIG. 11A) and embodiments of notebook computer with an active cooling system described herein, such as vented notebook computer 1100B. More specifically, FIG. 11A depicts notebook computer 1100A that does not utilize a cooling system described herein. Although notebook computer 1100A includes vents, fluid flow indicated by lines 1102A is minimal. FIG. 11B depicts an embodiment of open (i.e. vented) notebook computer 1100B including cooling system 1102B as described herein. Thus, for notebook computer 1100B, cooled air from outside of the notebook computer enters via inlets 1103B, is directed toward cooling system 1001B and may be used by the cooling system for cooling heat-generating structures. The heated fluid is directed toward outlet 1104B. Thus, heated fluid is vented from notebook computer 1100B. Fluid flow is shown by lines 1102B, of which only three are labeled. FIG. 11C is a graph including curves 1110, 1120 and 1130 indicating the power usable by the processors in notebook computer 1100A, an embodiment of a closed notebook computer (not shown in FIGS. 11A-11C) and vented notebook computer 1100B, respectively. As can be seen in FIG. 11D, curve 1110 for the notebook computer that does not use a cooling system described herein utilizes lower power because of heating of the processor. Curve 1120 indicates that the processor for a closed notebook computer using a cooling system described herein can utilize (and dissipate) higher power. Curve 1130 indicates that a processor for a vented notebook computer using a cooling system described herein may utilize even higher power and may resist throttling for longer. Thus, performance may be improved. Further, as described above, because of the size of the cooling system, the thickness of a notebook computer utilizing the cooling system may remain unchanged. In addition, hot spots on the covers of notebook 1100B may be reduced in temperature or eliminated.

Figure 12A:
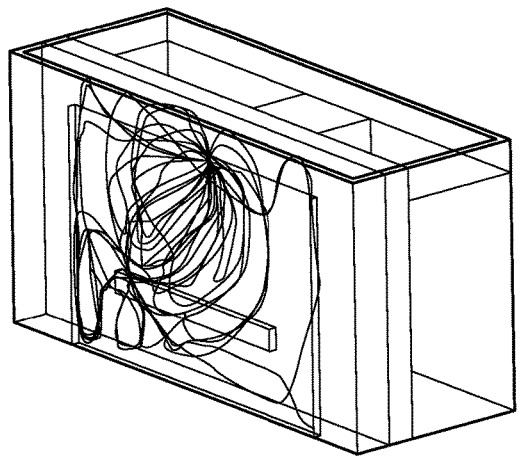
FIGS. 12A-12D depict performance for embodiments of notebooks with and without cooling systems.
Figure 12B:
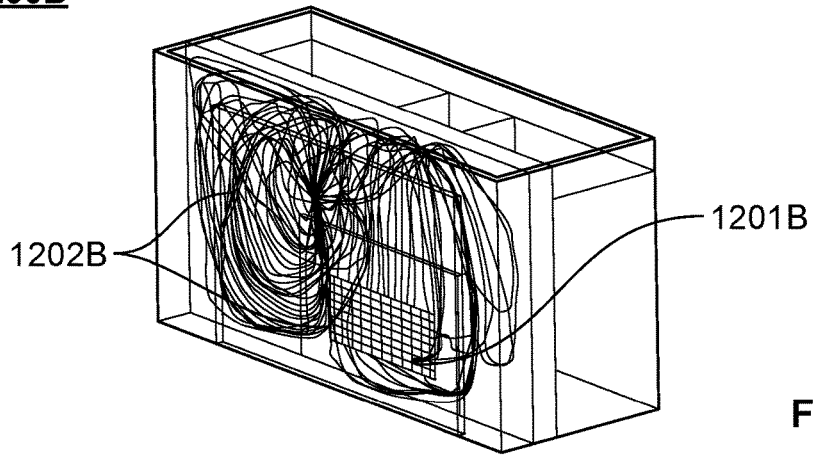

Similarly, FIGS. 12A-12D depict embodiments of and performance for a virtual reality device with and without cooling systems such as are described herein. More specifically, FIG. 12A depicts virtual reality device 1200A that does not utilize active cooling as described herein. Thus, fluid flow is minimal within virtual reality device 1200A. FIG. 12B depicts an embodiment of closed virtual reality device 1200B including active cooling system 1201B as described herein. Thus, fluid (e.g. air) used in cooling the virtual reality device 1200B depicted in FIG. 12B remains within the virtual reality device. Virtual reality device 1200B is configured such that fluid follows a path from the surface of the heat-generating structure(s) near cooling system 1201B past structure(s) having lower temperature(s) than the surface of the heat-generating structure. The structure(s) absorb heat from the fluid. The fluid then returns to cooling system 1201B. The path of the fluid may be seen by lines 1202B of which only two are labeled.

Figure 12C:
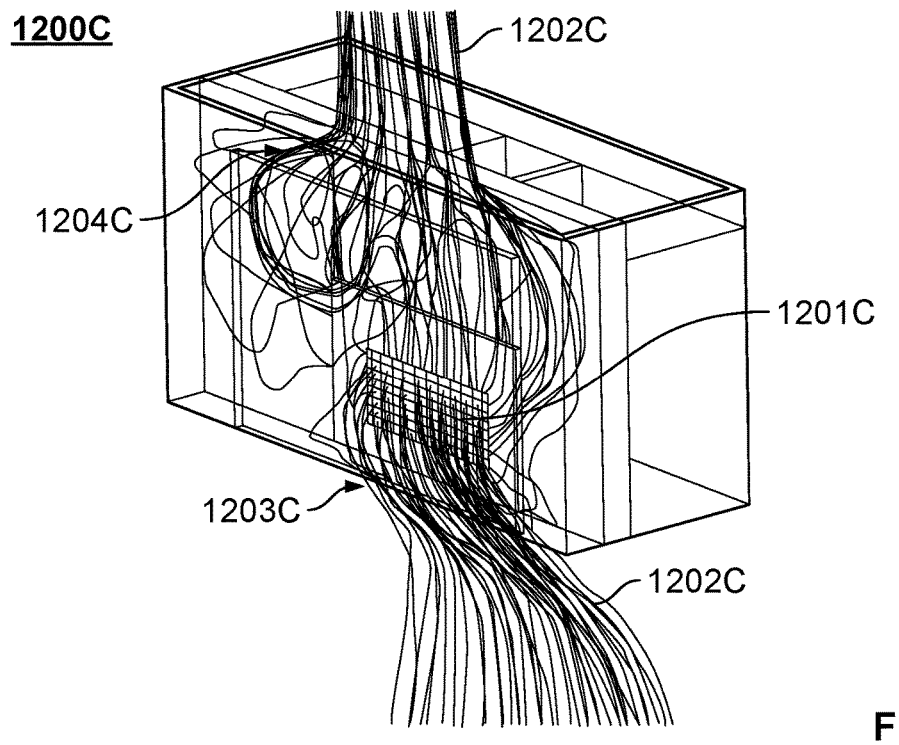

FIG. 12C depicts an embodiment of vented virtual reality device 1200C including cooling system 1201C as described herein. Vented virtual reality device 1200C also includes inlet 1203C and outlet 1204C. Thus, for virtual reality device 1200C depicted in FIG. 12C, cooled air from outside of virtual reality device 1200C may be used by the cooling system for cooling heat-generating structures and heated fluid vented from the virtual reality device. Vented virtual reality device 1200C is configured such that cooler fluid enters via inlets 1203C and is driven toward a heat-generating structure by active cooling system 1201C, as described previously. The fluid extracts heat from the heat-generating structure and follows a path from the surface of the heat-generating structure(s) near cooling system 1201C past structure(s) having lower temperature(s) than the surface of the heat-generating structure. The structure(s) absorb heat from the fluid. The fluid is directed out of vented virtual reality device 1200C via outlet 1204C. The path of the fluid may be seen by lines 1202C of which only two are labeled.

Figure 12D:
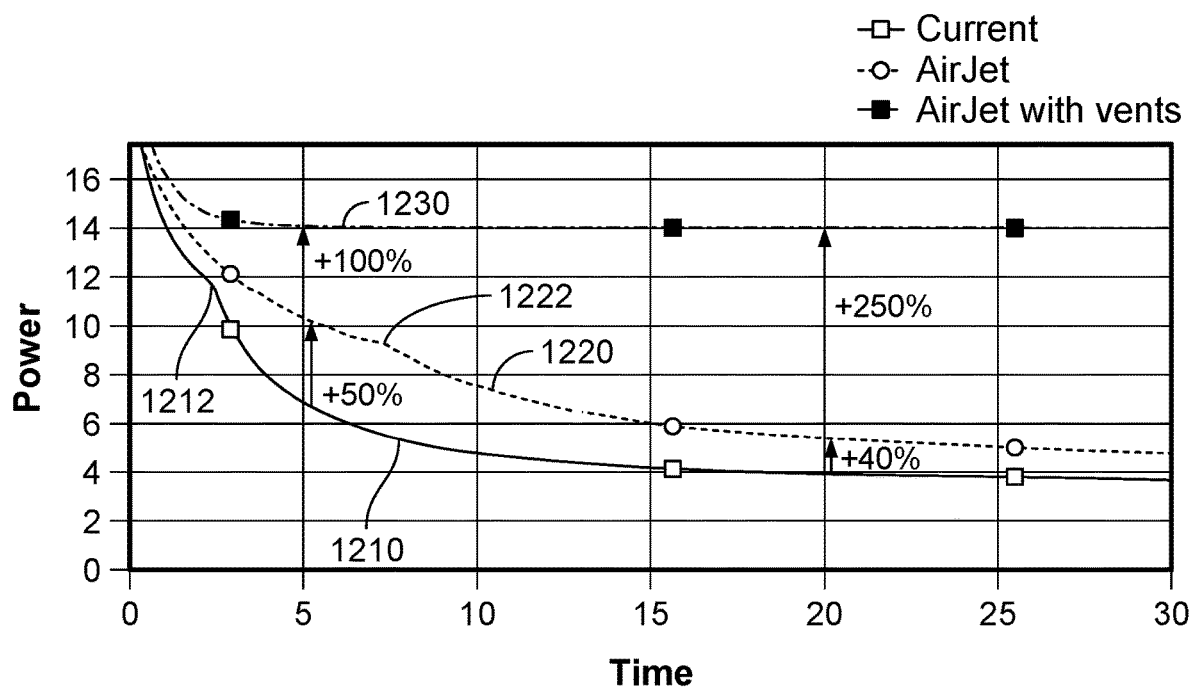

FIG. 12D is a graph including curves 1210, 1220 and 1230 indicating the power usable by virtual reality devices 1200A, 1200B and 1200C, respectively. FIG. 12D is for explanatory purposes only and is not intended to correspond to particular devices. As can be seen in FIG. 12D, curve 1210 for virtual reality device 1200A (no active cooling system described herein) utilizes lower power because of heating of the processor. Further, the processor commences throttling at point 1212 sooner. Curve 1220 indicates that the processor for closed virtual reality device 1200B using cooling system 1201B described herein can utilize (and dissipate) higher power. Further, the throttling at point 1222 occurs later than for curve 1210. Curve 1230 indicates that a processor for vented virtual reality device 1200C using a cooling system described herein may utilize even higher power and may resist throttling for longer. Thus, performance may be improved. Further, as described above, because of the size of the cooling system, the thickness of a virtual reality device utilizing the cooling system may remain unchanged. In addition, hot spots on the covers of virtual reality devices 1200A, 1200B and 1200C may be reduced in temperature or eliminated.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
an active cooling system including a cooling element in communication with a fluid and configured to use vibrational motion to direct the fluid toward a surface of at least one heat-generating structure to extract heat from the at least one heat-generating structure, the at least one heat-generating structure being part of the system having a case, the active cooling system being within the case, wherein the cooling element is a centrally anchored cooling element, the centrally anchored cooling element having a central region, the central region having a perimeter, the centrally anchored cooling element being supported by a support structure at the central region, a first portion of the perimeter of the central region undergoing the vibrational motion, a second portion of the perimeter of the central region being located on an opposite side of the central region from the first portion and undergoing the vibrational motion, an orifice plate being disposed between the cooling element and the surface of the at least one heat-generating structure, an orifice being disposed in the orifice plate, a jet channel being located between a surface of the orifice plate and the surface of the at least one heat-generating structure;
wherein the system is configured such that the fluid follows a path from the surface of the at least one heat-generating structure past a structure of the system having a lower temperature than the surface of the at least one heat-generating structure, the structure absorbing heat from the fluid, the structure being within the system and distal from the active cooling system, wherein the path of the fluid includes passing through the orifice in the orifice plate to the jet channel.

2. The system of claim 1, wherein the system is configured such that the fluid follows the path from the surface of the at least one heat-generating structure past the structure and returns to the active cooling system.

3. The system of claim 1, further comprising:
at least one vent allowing fluid communication with an external environment; and
wherein the system is configured such that the fluid follows the path from the surface of the at least one heat-generating structure past the structure and exits the system to the external environment through the at least one vent.

4. The system of claim 1, wherein the cooling element includes a first side and a second side, the first side being distal to the at least one heat-generating structure and in communication with the fluid, the second side being proximal to the at least one heat-generating structure, the cooling element being configured to direct the fluid from the first side to the second side using the vibrational motion such that the fluid travels toward the surface of the at least one heat-generating structure.

5. The system of claim 1, wherein the case of the system includes an inlet, the active cooling system being configured to reduce an external surface temperature of a region of the case proximate to the inlet by at least five degrees Celsius.

6. The system of claim 1, wherein the thickness of the active cooling system is not more than two millimeters.

7. The system of claim 1, wherein the at least one heat-generating structure has a characteristic power versus time curve having a characteristic throttling point at a first time, the at least one heat-generating structure has an actively cooled power versus time curve having an actively cooled throttling point at a second time, the first time being less than the second time.

8. A system, comprising:
an active cooling system including a plurality of cooling cells, each of the plurality of cooling cells including a cooling element in communication with a fluid and configured to use vibrational motion to direct the fluid toward a surface of at least one heat-generating structure to extract heat from the at least one heat-generating structure, the at least one heat-generating structure being part of the system having a case, the active cooling system being within the case, wherein the cooling element is a centrally anchored cooling element, the centrally anchored cooling element having a central region, the central region having a perimeter, the centrally anchored cooling element being supported by a support structure at the central region, a first portion of the perimeter of the central region undergoing the vibrational motion, a second portion of the perimeter of the central region being located on an opposite side of the central region from the first portion and undergoing the vibrational motion, an orifice plate being disposed between the cooling element and the surface of the at least one heat-generating structure, an orifice being disposed in the orifice plate, a jet channel being located between a surface of the orifice plate and the surface of the at least one heat-generating structure;
wherein the system is configured such that the fluid follows a path from the surface of the at least one heat-generating structure past a structure within the system, the structure absorbing heat from the fluid, the structure being within the system and distal from the active cooling system, wherein the path of the fluid includes passing through the orifice in the orifice plate to the jet channel.

9. The system of claim 8, wherein the system is configured such that the fluid follows the path from the surface of the at least one heat-generating structure past the structure and returns to the active cooling system.

10. The system of claim 8, further comprising:
at least one vent allowing fluid communication with an external environment; and
wherein the system is configured such that the fluid follows the path from the surface of the at least one heat-generating structure past the structure and exits the system to the external environment through the at least one vent.

11. The system of claim 8, wherein the cooling element includes a first side and a second side, the first side being distal to the at least one heat-generating structure and in communication with the fluid, the second side being proximal to the at least one heat-generating structure, the cooling element being configured to direct the fluid from the first side to the second side using the vibrational motion such that the fluid travels toward the surface of the at least one heat-generating structure.

12. The system of claim 8, wherein the case of the system includes an inlet, the active cooling system being configured to reduce an external surface temperature of a region of the case proximate to the inlet by at least five degrees Celsius.

13. The system of claim 8, wherein the thickness of the active cooling system is not more than two millimeters.

14. The system of claim 8, wherein the at least one heat-generating structure has a characteristic power versus time curve having a characteristic throttling point at a first time, the at least one heat-generating structure has an actively cooled power versus time curve having an actively cooled throttling point at a second time, the first time being less than the second time.

15. A method, comprising:
   driving a cooling element of an active cooling system to induce vibrational motion at a frequency, the cooling element being in communication with a fluid and configured to use the vibrational motion to direct the fluid toward a surface of at least one heat-generating structure to extract heat from the at least one heat-generating structure, the heat-generating structure being part of a system having a case, the active cooling system being within the case, wherein the cooling element is a centrally anchored cooling element, the centrally anchored cooling element having a central region, the central region having a perimeter, the centrally anchored cooling element being supported by a support structure at the central region, a first portion of the perimeter of the central region undergoing the vibrational motion, a second portion of the perimeter of the central region being located on an opposite side of the central region from the first portion and undergoing the vibrational motion, an orifice plate being disposed between the cooling element and the surface of the at least one heat-generating structure, an orifice being disposed in the orifice plate, a jet channel being located between a surface of the orifice plate and the surface of the at least one heat-generating structure; and
   directing the fluid to follow a path from the surface of the at least one heat-generating structure past a wherein the system is configured such that the fluid follows a path from the surface of the at least one heat-generating structure past a structure of the system having a lower temperature than the surface of the at least one heat-generating structure, the structure absorbing heat from the fluid, the structure being within the system and distal from the active cooling system, wherein the path of the fluid includes passing through the orifice in the orifice plate to the jet channel.

16. The method of claim 15, wherein the directing of the fluid further includes:
   directing the fluid to follow the path from the surface of the at least one heat-generating structure past the structure and return to the active cooling system.

17. The method of claim 15, wherein the directing of the fluid further includes:
   directing the fluid to follow the path from the surface of the at least one heat-generating structure past the structure and exit the system to an external environment through at least one vent.

18. The method of claim 15, wherein the at least one heat-generating structure has a characteristic power versus time curve having a characteristic throttling point at a first time, the at least one heat-generating structure has an actively cooled power versus time curve having an actively cooled throttling point at a second time, the first time being less than the second time.

* * * * *